(12) United States Patent
Lee et al.

(10) Patent No.: US 11,288,998 B2
(45) Date of Patent: Mar. 29, 2022

(54) DISPLAY DEVICE HAVING A FIRST DISPLAY AREA AND A SECOND DISPLAY AREA HAVING A TRANSMISSION AREA

(71) Applicant: Samsung Display Co., Ltd., Yongin-Si (KR)

(72) Inventors: Sangshin Lee, Yongin-si (KR); Seungjin Lee, Yongin-si (KR); Yeonju Kang, Yongin-si (KR); Sanghoon Kim, Yongin-si (KR); Jongsung Park, Yongin-si (KR); Eunjoung Jung, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/986,332

(22) Filed: Aug. 6, 2020

(65) Prior Publication Data

US 2021/0241671 A1 Aug. 5, 2021

(30) Foreign Application Priority Data

Feb. 3, 2020 (KR) .................. 10-2020-0012712

(51) Int. Cl.
  *G09G 3/32* (2016.01)
  *G09G 3/20* (2006.01)
  *G09G 3/3225* (2016.01)
  *H01L 27/32* (2006.01)

(52) U.S. Cl.
  CPC ......... *G09G 3/2003* (2013.01); *G09G 3/3225* (2013.01); *H01L 27/3216* (2013.01); *H01L 27/3218* (2013.01); *G09G 2300/0452* (2013.01)

(58) Field of Classification Search
  CPC .......... G09G 3/2003; G09G 3/20; G09G 3/32; H01L 27/3216; H01L 27/3218
  See application file for complete search history.

(56) References Cited

U.S. PATENT DOCUMENTS

| | | | |
|---|---|---|---|
| 8,363,072 B2 | 1/2013 | Hong et al. | |
| 8,786,182 B2 | 7/2014 | Park et al. | |
| 9,852,691 B2 | 12/2017 | Hyun | |
| 2010/0039011 A1* | 2/2010 | Karaki | H01L 27/3216 313/1 |
| 2016/0093679 A1* | 3/2016 | Moon | H01L 27/3246 257/40 |
| 2019/0130822 A1 | 5/2019 | Jung et al. | |
| 2019/0296096 A1* | 9/2019 | Tian | G09G 3/3225 |

(Continued)

FOREIGN PATENT DOCUMENTS

| | | |
|---|---|---|
| CN | 108461521 A | 8/2018 |
| KR | 10-2011-0108050 A | 10/2011 |
| KR | 10-2012-0041510 A | 5/2012 |

(Continued)

*Primary Examiner* — Pegeman Karimi
(74) *Attorney, Agent, or Firm* — Innovation Counsel LLP

(57) ABSTRACT

A display device includes: a substrate including a first display area and a second display area including a transmission area; first pixels in the first display area; and second pixels in the second display area, wherein a distance between a first sub-pixel from among the first pixels, the first sub-pixel being adjacent to a boundary area between the first display area and the second display area, and a second sub-pixel from among the second pixels, the second sub-pixel being adjacent to the boundary area, is set to a certain value.

23 Claims, 20 Drawing Sheets

(56) References Cited

U.S. PATENT DOCUMENTS

2020/0066809 A1    2/2020   Liu
2021/0065625 A1*   3/2021   Wang .................. G09G 3/3233

FOREIGN PATENT DOCUMENTS

| KR | 10-1257734 B1 | 4/2013 |
| KR | 10-2016-0089555 A | 7/2016 |
| KR | 10-2017-0113066 A | 10/2017 |

* cited by examiner

DISPLAY DEVICE HAVING A FIRST DISPLAY AREA AND A SECOND DISPLAY AREA HAVING A TRANSMISSION AREA

CROSS-REFERENCE TO RELATED APPLICATION

This application claims the benefit of Korean Patent Application No. 10-2020-0012712, filed on Feb. 3, 2020, in the Korean Intellectual Property Office, the disclosure of which is incorporated herein in its entirety by reference.

BACKGROUND

1. Field

One or more embodiments relate to a display device.

2. Description of Related Art

Applications of display devices have recently diversified. Moreover, because display devices have become thinner and lighter, their range of use has increased.

As the display devices may be utilized in various ways, various methods may be used to design the shapes of the display devices and the number of functions that may be embedded in or linked to the display devices has increased.

SUMMARY

One or more embodiments include a display device including a first display area, which is a main display area, and a second display area, in which an optical element or the like may be arranged under the first display area.

Additional aspects will be set forth in part in the description which follows and, in part, will be apparent from the description, or may be learned by practice of the presented embodiments of the disclosure.

According to one or more embodiments, a display device includes: a substrate including a first display area and a second display area including a transmission area; first pixels in the first display area; and second pixels in the second display area. A distance between a first sub-pixel from among the first pixels, the first sub-pixel being adjacent to a boundary area between the first display area and the second display area and emitting light of a first color, and a second sub-pixel from among the second pixels, the second sub-pixel being adjacent to the boundary area, emitting light of the first color, and through which a virtual line passing through a center of the first sub-pixel passes, has a value based on a pixel pitch.

The second sub-pixel may be a pixel through which the virtual line first passes from among the second pixels.

The second pixels may be in units of pixel groups, wherein transmission areas may surround the pixel groups.

A structuring of the second pixels constituting the pixel groups is the same as or different from a structuring of the first pixels.

The area of each of the second pixels may be different from the area of a first pixel corresponding to the second pixel.

The pixel pitch may be a center distance between first pixels emitting green light.

The virtual line may be parallel to data lines or scan lines connected to the second pixels.

The distance between the first sub-pixel and the second sub-pixel may be a shortest straight-line distance between an edge of the first sub-pixel and an edge of the second sub-pixel.

The distance between the first sub-pixel and the second sub-pixel may be greater than or equal to the pixel pitch.

The distance between the first sub-pixel and the second sub-pixel may be a shortest straight-line distance between a line passing through a center of the first sub-pixel and a line passing through a center of the second sub-pixel.

The distance between the first sub-pixel and the second sub-pixel may be within a certain range of twice the pixel pitch.

The distance between the first sub-pixel and the second sub-pixel may be within ±30% of twice the pixel pitch.

The display device may further include an inorganic insulating layer on the substrate, wherein the inorganic insulating layer may include an opening corresponding to the transmission area and the boundary area.

A distance between a third sub-pixel from among the first pixels, the third sub-pixel being adjacent to the boundary area and emitting light of a second color, and a fourth sub-pixel from among the second pixels, the fourth sub-pixel being adjacent to the boundary area, emitting light of a color different from the second color, and through which a virtual line passing through a center of the third sub-pixel passes, may have a minimum value among gap values of a pixel-defining layer between the first pixels and gap values of a pixel-defining layer between the second pixels, or a value that is greater than the minimum value.

According to one or more embodiments, a display device includes: a substrate including a first display area and a second display area including a transmission area; first pixels in the first display area; and second pixels in the second display area, wherein a distance between a first sub-pixel from among the first pixels, the first sub-pixel being adjacent to the boundary area between the first display area and the second display area and emitting light of a first color and a second sub-pixel from among the second pixels, the second sub-pixel being adjacent to the boundary area, emitting light of a color different from the first color, and through which a virtual line passing through a center of the first sub-pixel passes, is greater than or equal to a minimum value among gap values of a pixel-defining layer between the first pixels and gap values of a pixel-defining layer between the second pixels.

The second sub-pixel may be a pixel through which the virtual line first passes among the second pixels, and the virtual line may be parallel to data lines or scan lines connected to the second pixels.

The second pixels may be in units of pixel groups, wherein transmission areas may surround the pixel groups, and a structuring of the second pixels constituting the pixel groups may be different from a structuring of the first pixels.

According to one or more embodiments, a display device includes: a substrate including a first display area and a second display area including a transmission area; first pixels in the first display area; and second pixels in the second display area, wherein a center distance between a first sub-pixel from among the first pixels, the first sub-pixel being adjacent to a boundary area between the first display area and the second display area and emitting light of a first color, and a second sub-pixel from among the second pixels, the second sub-pixel adjacent to the boundary area and emits light of the first color and through which a virtual line passing through a center of the first sub-pixel passes, is within a certain range of twice a pixel pitch.

The second pixels may be in units of pixel groups, wherein transmission areas may surround the pixel groups, and a structuring of the second pixels constituting the pixel groups may be the same as or different from a structuring of the first pixels.

The pixel pitch may be a center distance between first pixels emitting green light, and the virtual line may be parallel to data lines or scan lines connected to the second pixels.

BRIEF DESCRIPTION OF THE DRAWINGS

The above and other aspects, and features of certain embodiments of the disclosure will be more apparent from the following description taken in conjunction with the accompanying drawings.

DETAILED DESCRIPTION

Figure 1A:
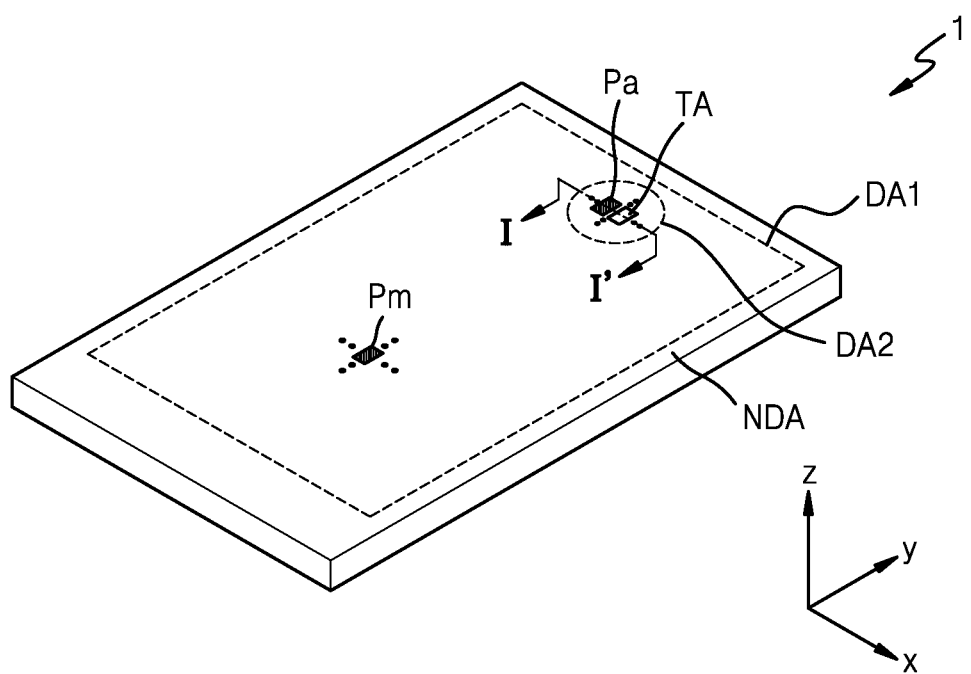
FIGS. 1A and 1B are schematic perspective views of display devices according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or other variations.

One or more embodiments of the disclosure will be described below in more detail with reference to the accompanying drawings. Those elements that are the same or are in correspondence are rendered the same reference numeral regardless of the figure number, and redundant explanations are omitted.

It will be understood that although the terms "first," "second," etc. may be used herein to describe various elements, these elements can be described using different terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, sizes and thicknesses of elements in the drawings are arbitrarily illustrated for convenience of explanation.

When a certain embodiment may be implemented differently, a specific process order may be performed differently from the described order. For example, two consecutively described processes may be performed substantially at the same time or performed in an order opposite to the described order.

In the following embodiments, "A and/or B" represents A, B, or A and B. "at least one of A and B" represents A, B, or A and B.

In the following embodiments, when layers, regions, or elements are connected to each other, the layers, the regions, or the elements may be directly connected to each other, or another layer, another region, or another element may be interposed between the layers, the regions, or the elements. Thus, the layers, the regions, or the elements may be indirectly connected to each other. For example, in the following embodiments, when layers, regions, or elements are electrically connected to each other, the layers, the regions, or the elements may be directly electrically connected to each other, or another layer, another region, or another element may be interposed between the layers, the regions, or the elements. Thus, the layers, the regions, or the elements may be indirectly electrically connected to each other.

The x-axis, the y-axis and the z-axis are the three axes of the rectangular coordinate system, but may be interpreted in a broader sense. For example, the x-axis, the y-axis, and the z-axis may be perpendicular to one another, or may represent different directions that are not perpendicular to one another.

Figure 1B:
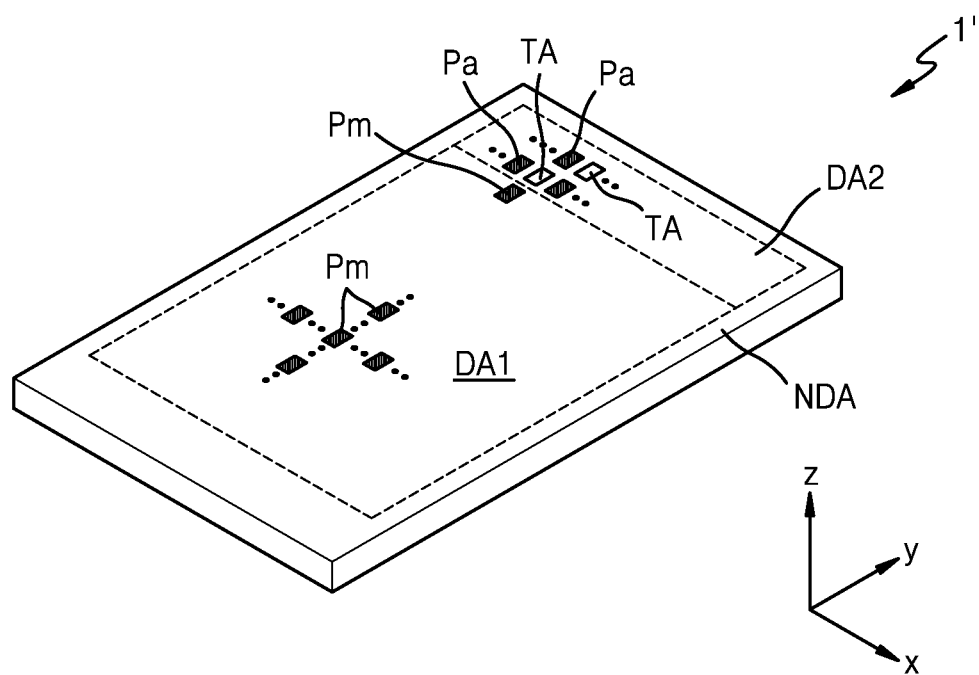

FIGS. 1A and 1B are schematic perspective views of display devices 1 and 1' according to embodiments.

Referring to FIG. 1A, the display device 1 includes a first display area DA1 and a second display area DA2, in which images are realized, and a non-display area NDA, in which no images are realized. The display device 1 may provide a main image by using light emitted from first pixels Pm in the first display area DA1.

The display device 1 includes the second display area DA2. The second display area DA2 may be an area under which a component such as a sensor or camera, e.g., an image sensor, using infrared light, visible light, or sound is positioned, as will be described later with reference to FIG. 2. The second display area DA2 may include a transmission portion TA capable of transmitting light or/and sound that is output from a component to the outside or travels from the outside toward the component. In an embodiment, when infrared or visible light is transmitted through the second display area DA2, a light transmittance in the second display area DA2 may be about 30% or greater, 50% or greater, 75% or greater, 80% or greater, 85% or greater, or 90% or greater.

Second pixels Pa may be in the second display area DA2, and a certain image may be provided using light emitted from the second pixels Pa. An image provided by the second display area DA2 may be an auxiliary image. In an embodiment, resolution in the second display area DA2 and resolution in the first display area DA1 may be the same. In an embodiment, resolution in the second display area DA2 may be lower than that in the first display area DA1. In other words, because the second display area DA2 includes the transmission portion TA capable of transmitting light or/and sound, the number of second pixels Pa on a unit area may be less than the number of first pixels Pm on a unit area in the first display area DA1.

FIG. 1A illustrates that one second display area DA2 is in the first display area DA1. In an embodiment, the number of second display areas DA2 may be two or more, and shapes and sizes of the second display areas DA2 provided in plural may be different from each other.

In FIG. 1A, the second display area DA2 is illustrated as having a substantially circular shape. However, in embodiments, a plan view, i.e., when viewed in a direction perpendicular to a main surface of a substrate, the second display area DA2 may have one of various shapes such as a circle, an ellipse, a polygon such as a rectangle, a star shape, and a diamond shape.

The second display area DA2 may be at least partially surrounded by the first display area DA1. For example, as shown in FIG. 1A, the second display area DA2 may be on one side, e.g., upper center, of the first display area DA1 having a rectangular shape. In an embodiment, the second display area DA2 may be on one side of the first display area DA1. FIG. 1B illustrates that the second display area DA2 is between the non-display area NDA and the first display area DA1.

The non-display area NDA may be a peripheral area outside the first display area DA1 and the second display area DA2. The non-display area NDA may be an area in which pixels are not positioned. The first display area DA1 and the second display area DA2 may be entirely surrounded by the non-display area NDA.

An organic light-emitting display device will now be illustrated and described as the display device 1. In an embodiment, the display device 1 may be a display device, such as an inorganic light-emitting display device, e.g., an inorganic electroluminescence (EL) display device, or a quantum dot light-emitting display device. For example, an emission layer of a display element in the display device 1 may include an organic material, include an inorganic material, include a quantum dot, include an organic material and a quantum dot, or include an inorganic material and a quantum dot.

Figure 2:
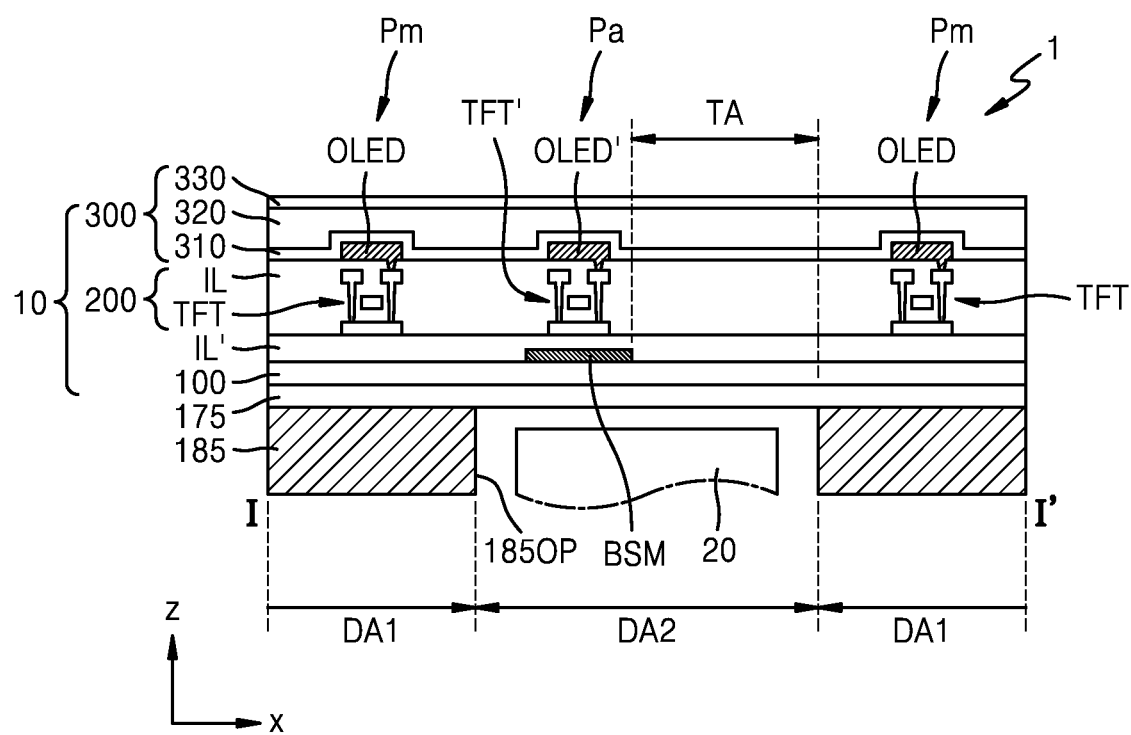
FIG. 2 is a schematic cross-sectional view of a display device according to an embodiment.

FIG. 2 is a schematic cross-sectional view of the display device 1 according to an embodiment. FIG. 2 may correspond to a cross-section taken along line I-I' of FIG. 1A.

Referring to FIG. 2, the display device 1 may include a display panel 10 including a display element, and a component 20 positioned to correspond to a second display area DA2.

The display panel 10 may include a substrate 100, a display element layer 200 on the substrate 100, and a thin-film encapsulation layer 300 being an encapsulation member that seals the display element layer 200. The display panel 10 may further include a lower protection film 175 and a lower cover layer 185, which are positioned under the substrate 100.

The display element layer 200 may include a circuit layer including thin-film transistors TFT and TFT', organic light-emitting diodes OLED and OLED' as display elements, and insulating layers IL and IL' between the thin-film transistors TFT and TFT' and the organic light-emitting diodes OLED and OLED'.

The first pixel Pm including the organic light-emitting diode OLED may be in the first display area DA1, and the first pixel Pm may be connected to a pixel circuit including the thin-film transistor TFT.

The second pixel Pa including the organic light-emitting diode OLED' may be in the second display area DA2, and the second pixel Pa may be connected to a pixel circuit including the thin-film transistor TFT'.

In the second display area DA2, the transmission area TA in which the thin-film transistor TFT' and the second pixel Pa are not disposed may be positioned. The transmission area TA may be an area that transmits light/signals emitted by the component 20 or light/signals incident upon the component 20.

The component 20 may be located in the second display area DA2. The component 20 may be an electronic element that uses light or sound. For example, the component 20 may be a sensor that receives and uses light, like an infrared sensor, a sensor that outputs and senses light or sound to measure a distance or recognize a fingerprint or the like, a small lamp that outputs light, a speaker that outputs sound, or an image sensor that captures an image. An electronic element using light may use light in various wavelength bands, such as visible light, infrared light, and ultraviolet light. The components 20 may be in the second display area DA2. For example, a light-emitting device and a light-receiving device as the component 20 may be both included in a single second display area DA2. Alternatively, both a light-emitting portion and a light-receiving portion may be included in a single component 20.

A metal layer BSM may be in the second display area DA2. The metal layer BSM may correspond to a lower portion of the thin-film transistor TFT'. The metal layer BSM may be a light-blocking layer that blocks external light from reaching the thin-film transistor TFT' and the like. For example, the metal layer BSM may block light emitted from the component 20 from reaching the second pixel Pa. In some embodiments, a constant voltage or a signal may be applied to the metal layer BSM to prevent damage to a pixel circuit due to electrostatic discharge.

The thin-film encapsulation layer 300 may include at least one inorganic encapsulation layer and at least one organic encapsulation layer. FIG. 2 illustrates first and second inorganic encapsulation layers 310 and 330 and an organic encapsulation layer 320 between the first and second inorganic encapsulation layers 310 and 330.

Each of the first inorganic encapsulation layer 310 and the second inorganic encapsulation layer 330 may include one or more inorganic insulating materials, such as aluminum oxide, titanium oxide, tantalum oxide, hafnium oxide, zinc oxide, silicon oxide, silicon nitride, and/or silicon oxynitride. The organic encapsulation layer 320 may include a polymer-based material. Examples of the polymer-based material may include acryl-based resin, epoxy-based resin, polyimide, and polyethylene.

The lower protection film 175 may be attached to a lower surface of the substrate 100 and may support and protect the substrate 100. The lower protection film 175 may include a material having high transmittance with respect to light. The lower protection film 175 may include polyethylene terephthalate (PET) or polyimide (PI).

The lower cover layer 185 may be under the lower protection film 175. The lower cover layer 185 may include an opening 185OP corresponding to the second display area DA2. By including the opening 185OP in the lower cover layer 185, the light transmittance of the second display area DA2 may be improved. The lower cover layer 185 may include a light blocking material. Accordingly, external light that may be transmitted to the lower surface of the substrate 100 may be blocked.

The second display area DA2 may have a larger area than an area where the component 20 is positioned. Accordingly, the area of the opening 185OP in the lower cover layer 185 may not be identical to the area of the second display area DA2. For example, the area of the opening 185OP may be less than the area of the second display area DA2.

In addition, components 20 may be in the second display area DA2. The components 20 may have different functions.

Although not shown, a component(s), such as an input sensing member for sensing a touch input, an anti-reflection member including a polarizer and a retarder, or a color filter and a black matrix, and a transparent window, may be on the display panel 10.

In the present embodiment, the thin-film encapsulation layer 300 is used as an encapsulation member that seals the display element layer 200. However, in an embodiment, an encapsulation substrate coupled with the substrate 100 by a sealant or frit may be used as a member that seals the display element layer 200.

Figure 3:
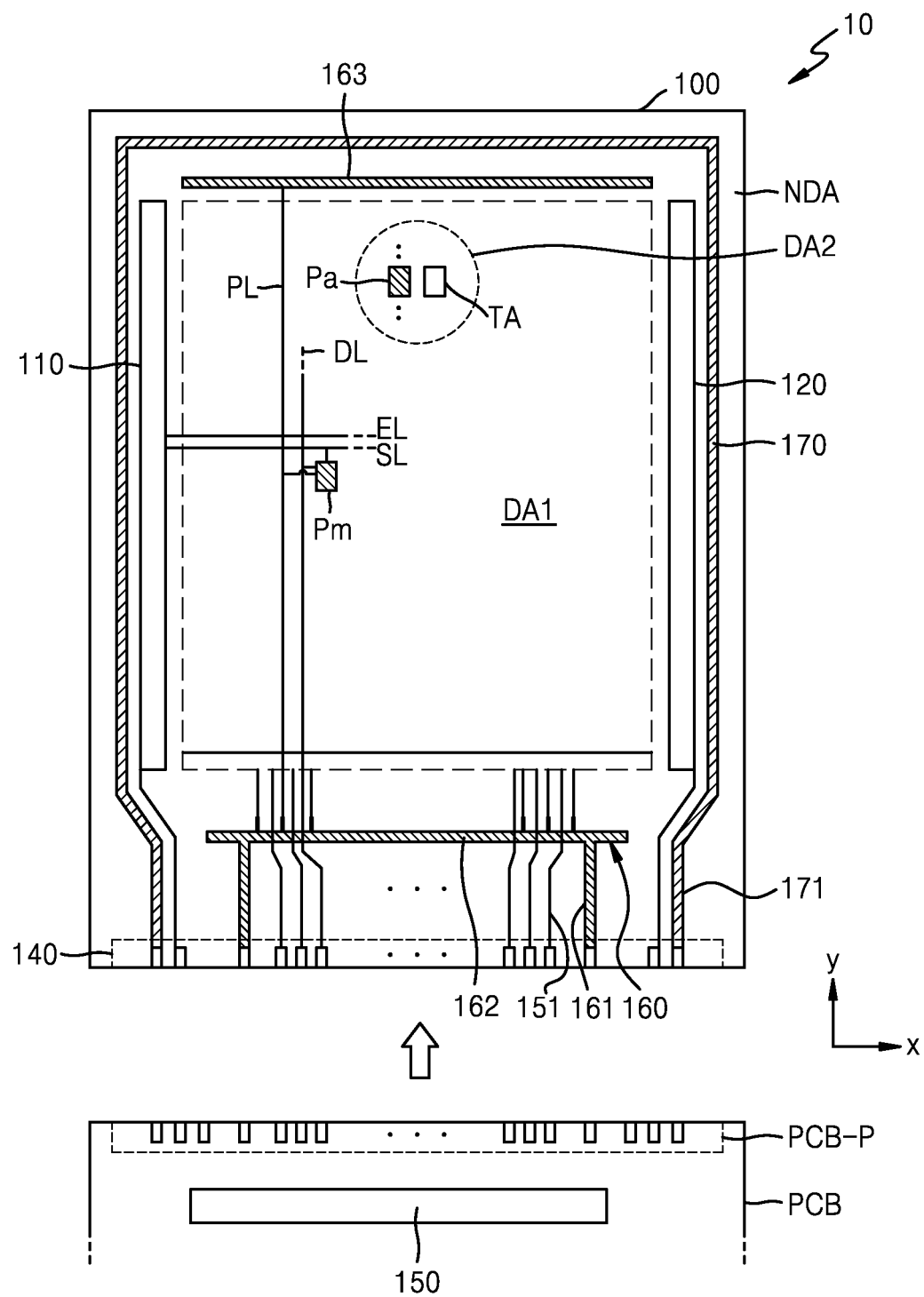
FIG. 3 is a schematic plan view of a display panel according to an embodiment.

FIG. 3 is a schematic plan view of the display panel 10 according to an embodiment.

Referring to FIG. 3, the display panel 10 may include the substrate 100. First pixels Pm may be on the first display area DA1 of the substrate 100. Each of the first pixels Pm may include a display element such as the organic light-emitting diode OLED in FIG. 2. Each of the first pixels Pm may emit red, green, blue, or white light through the organic light-emitting diode OLED.

The second display area DA2 may be on one side of the first display area DA1 or be surrounded by the first display area DA1, and second pixels Pa may be on the second display area DA2 of the substrate 100. Each of the second pixels Pa may include a display element such as the organic light-emitting diode OLED' in FIG. 2. Each of the second pixels Pa may emit red, green, blue, or white light through the organic light-emitting diode OLED'. The transmission area TA between the second pixels Pa may be provided in the second display area DA2. At least one component may be under the second display area DA2 of the substrate 100.

In an embodiment, as the second display area DA2 includes the transmission area TA, the resolution of the second display area DA2 may be less than the resolution of the first display area DA1. For example, the resolution of the second display area DA2 may be about ½ of the resolution of the first display area DA1. In some embodiments, the resolution of the first display area DA1 may be 400 ppi or more, and the resolution of the second display area DA2 may be about 200 ppi. In an embodiment, structures of a pixel circuit driving the second pixel Pa of the second display area DA2 and wiring lines transmitting signals to the pixel circuit are different from structures of a pixel circuit driving the first pixel Pm and wiring lines transmitting signals to the pixel circuit. Thus, the second display area DA2 may have the same resolution as that of the first display area DA1 while having the transmission area TA.

The first pixel Pm and the second pixel Pa may be electrically connected to driving circuits in the non-display area NDA. In the non-display area NDA, a first scan driving circuit 110, a second scan driving circuit 120, a terminal 140, a data driving circuit 150, a first power supply line 160, and a second power supply line 170 may be positioned.

The first scan driving circuit 110 may provide a scan signal to the first pixel Pm and the second pixel Pa through a scan line SL. The first scan driving circuit 110 may provide an emission control signal to each pixel through an emission control line EL. The second scan driving circuit 120 may be in parallel with the first scan driving circuit 110 with the first display area DA1 between the second scan driving circuit 120 and the first scan driving circuit 110. Some of the first pixels Pm and the second pixels Pa in the first display area DA1 and the second display area DA2 may be electrically connected to the first scan driving circuit 110, and the others may be electrically connected to the second scan driving circuit 120. In an embodiment, the second scan driving circuit 120 may be omitted.

The terminal 140 may be on one side of a substrate 100. The terminal 140 may be exposed by not being covered by an insulating layer and electrically connected to a printed circuit board PCB. A terminal PCB-P of the printed circuit board PCB may be electrically connected to the terminal 140 of the display panel 10. The printed circuit board PCB transmits a signal or power of a controller to the display panel 10. A control signal generated by the controller may be transmitted to the first and second scan driving circuits 110 and 120 through the printed circuit board PCB. The controller may provide first and second power supply voltages ELVDD and ELVSS, e.g., see FIGS. 4A and 4B, to the first and second power supply lines 160 and 170 through first and second connection lines 161 and 171, respectively. The first power supply voltage ELVDD may be provided to each of the first and second pixels Pm and Pa through a power voltage line PL connected to the first power supply line 160. The second power supply voltage ELVSS may be provided to an opposite electrode of each of the first and second pixels Pm and Pa connected to the second power supply line 170.

The data driving circuit 150 is electrically connected to a data line DL. A data signal of the data driving circuit 150 may be provided to each of the first and second pixels Pm and Pa through a connection line 151 connected to the terminal 140 and a data line DL connected to the connection line 151. FIG. 3 illustrates that the data driving circuit 150 is on the printed circuit board PCB. However, in an embodiment, the data driving circuit 150 may be on the substrate 100. For example, the data driving circuit 150 may be between the terminal 140 and the first power supply line 160.

The first power supply line 160 may include a first sub line 162 and a second sub line 163 extending in parallel in the x-direction with the first display area DA1 between the first sub line 162 and the second sub line 163. The second power supply line 170 may partially surround the first display area DA1 in a loop shape with one open side.

Figure 4A:
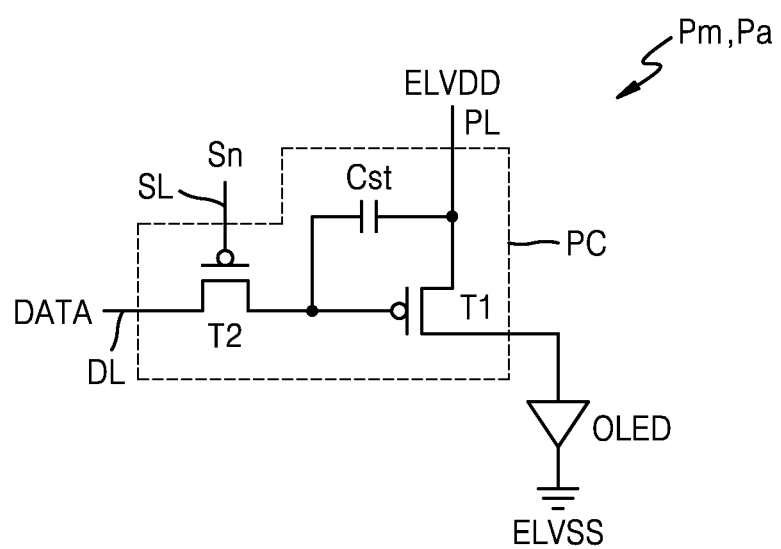
FIGS. 4A and 4B are respectively equivalent circuit diagrams of a first pixel and/or a second pixel of a display panel according to an embodiment.
Figure 4B:
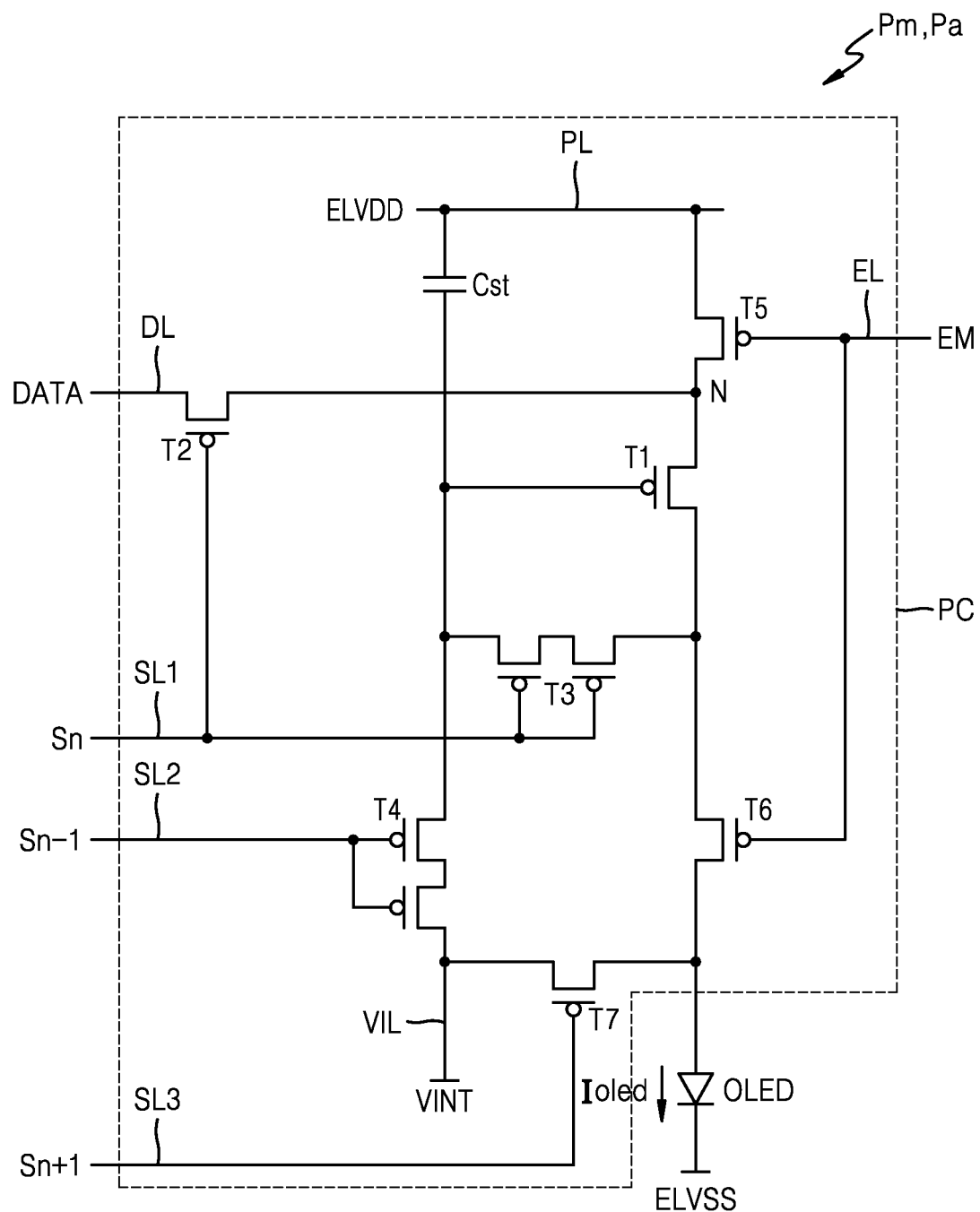

FIGS. 4A and 4B are equivalent circuit diagrams of a first pixel Pm and/or a second pixel Pa of a display panel according to an embodiment.

Referring to FIG. 4A, each of the first pixel Pm and the second pixel Pa may include an organic light-emitting diode OLED. The organic light-emitting diode OLED may be connected to a pixel circuit PC connected to a scan line SL and a data line DL. The pixel circuit PC includes a first transistor T1, a second transistor T2, and a capacitor Cst. The first transistor T1 and the second transistor T2 may be thin film transistors.

The second transistor T2, which is a switching transistor, is connected to the scan line SL and the data line DL, and transfers a data signal DATA input through the data line DL to the first transistor T1, according to a scan signal Sn input through the scan line SL.

The capacitor Cst is connected to the second transistor T2 and a power voltage line PL, and stores a voltage corresponding to a difference between a voltage received from the second transistor T2 and the first power supply voltage ELVDD, sometimes referred to as a driving voltage, supplied to the power voltage line PL.

The first transistor T1, which is a driving transistor, is connected to the power voltage line PL and the capacitor Cst, and may control a driving current flowing from the power voltage line PL to the organic light-emitting diode OLED, in accordance with a voltage value stored in the capacitor Cst. The organic light-emitting diode OLED may emit light having a certain brightness according to the driving current. An opposite electrode, e.g., a cathode, of the organic light-emitting diode OLED may receive the second power supply voltage ELVSS.

A case where the pixel circuit PC includes two transistors T1, T2 and one capacitor Cst is illustrated in FIG. 4A. As shown in FIG. 4B, in an embodiment, the pixel circuit PC may include seven transistors T1, T2, T3, T4, T5, T6, and T7 and one capacitor Cst.

Referring to FIG. 4B, the pixel circuit PC includes the first to seventh transistors T1 to T7, and the first to seventh transistors T1 to T7 may be thin-film transistors.

The pixel circuit PC may be connected to a first scan line SL1 that transmits a scan signal Sn, a second scan line SL2 that transmits a previous scan signal Sn−1, a third scan line SL3 that transmits a next scan signal Sn+1, an emission control line EL that transmits an emission control signal EM, and a data line DL that transmits a data signal DATA.

The power voltage line PL transmits the first power supply voltage ELVDD to the first transistor T1, and an initialization voltage line VIL transmits an initialization voltage VINT for initializing the first transistor T1 and the organic light-emitting diode OLED to a gate electrode of the first transistor T1 and the organic light-emitting diode OLED.

The first scan line SL1, the second scan line SL2, the third scan line SL3, the emission control line EL, and the initialization voltage line VIL extend in the x-direction and may be spaced apart from each other in each row. The data line DL and the power voltage line PL extend in the y-direction and may be spaced apart from each other in each column.

The first transistor T1 is connected to the power voltage line PL via the fifth transistor T5, and is electrically connected to the organic light-emitting diode OLED via the sixth transistor T6. The first transistor T1, which is a driving transistor, receives the data signal DATA according to a switching operation of the second transistor T2 and supplies a driving current $I_{oled}$ to the organic light-emitting diode OLED.

The second transistor T2 is connected to the first scan line SL1 and the data line DL, and is turned on according to the scan signal Sn received through the first scan line SL1 and performs a switching operation of transmitting the data signal DATA received from the data line DL to a node N.

The third transistor T3 is connected to the organic light-emitting diode OLED via the sixth transistor T6. The third transistor T3 is turned on according to the scan signal Sn received through the first scan line SL1, and thus, the first transistor T1 is diode-connected.

The fourth transistor T4 is turned on according to the previous scan signal Sn−1 received through the second scan line SL2 and is configured to transmit the initialization voltage VINT received from the initialization voltage line VIL to the gate electrode of the first transistor T1 to initialize a gate voltage of the first transistor T1.

The fifth transistor T5 and the sixth transistor T6 are simultaneously turned on according to the emission control signal EM received through the emission control line EL and form a current path such that the driving current $I_{oled}$ may flow from the power voltage line PL toward the organic light-emitting diode OLED.

The seventh transistor T7 is turned on according to the next scan signal Sn+1 received through the third scan line SL3 and is configured to transmit the initialization voltage VINT received from the initialization voltage line VIL to the organic light-emitting diode OLED to initialize the organic light-emitting diode OLED. The seventh transistor T7 may be omitted.

The capacitor Cst is connected to the power voltage line PL and the gate electrode of the first transistor T1, and may maintain a voltage applied to the gate electrode of the first transistor T1 by storing and maintaining a voltage corresponding to a difference between voltages at both ends of the capacitor Cst.

The organic light-emitting diode OLED includes a pixel electrode and an opposite electrode, and the opposite electrode may receive the second power voltage ELVSS. The organic light-emitting diode OLED receives the driving current $I_{oled}$ from the first transistor T1 and emits light to display an image.

In FIG. 4B, the third transistor T3 and the fourth transistor T4 are illustrated as having a dual gate electrode. However, each of the third transistor T3 and the fourth transistor T4 may have a single gate electrode. In FIG. 4B, the seventh transistor T7 is illustrated as receiving the next scan signal Sn+1 through the third scan line SL3. However, the seventh transistor T7 may be connected to the second scan line SL2 and receive the previous scan signal Sn−1.

In the present embodiment, the first pixel Pm and the second pixel Pa may have the same pixel circuit PC. However, in an embodiment, the first pixel Pm and the second pixel Pa may have pixel circuits having different structures. For example, the first pixel Pm may employ the pixel circuit of FIG. 4B, and the second pixel Pa may employ the pixel circuit of FIG. 4A.

Figure 5:
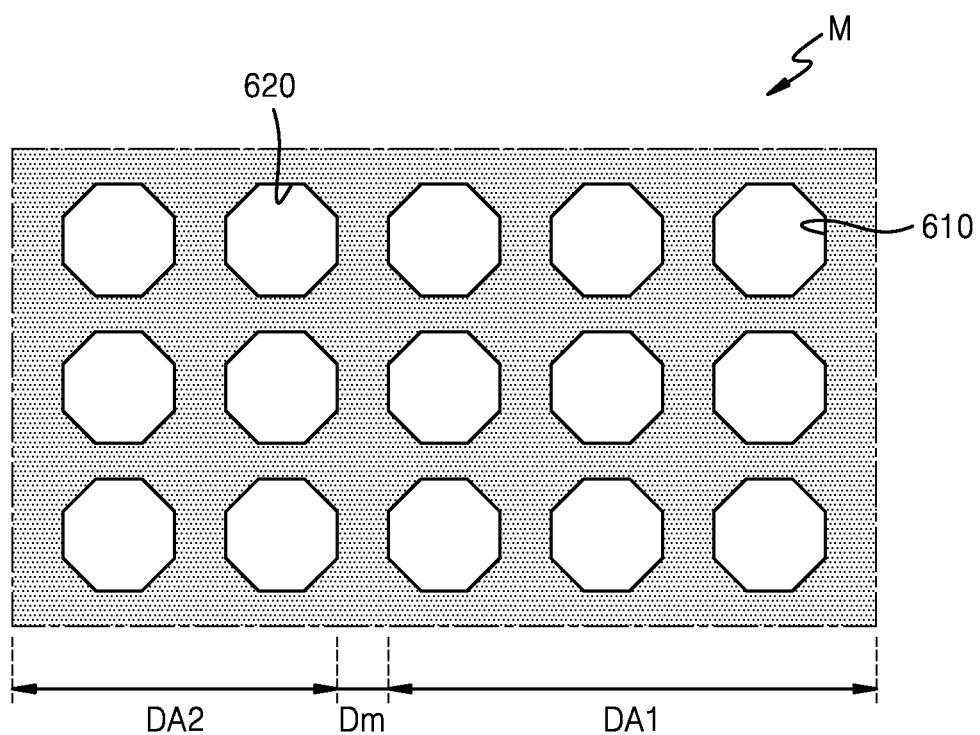
FIG. 5 is a view illustrating an example of a mask used for depositing an organic material.

FIG. 5 is a view illustrating an example of a mask M used for depositing an organic material.

Referring to FIG. 5, the mask M may include first mask openings 610 corresponding to the first display area DA1 and second mask openings 620 corresponding to the second display area DA2. The first mask openings 610 and the second mask openings 620 may be spaced apart from each other in the x-direction and the y-direction according to the positions of the first pixel Pm and the second pixel Pa.

An emission layer may be deposited on the first display area DA1 through each of the first mask openings 610 to form the first pixel Pm, and an emission layer may be deposited on the second display area DA2 through each of the second mask openings 620 to form the second pixel Pa. The first pixel Pm and the second pixel Pa formed through the first mask opening 610 and the second mask opening 620 may be sub-pixels emitting light of the same color. The first mask opening 610 and the second mask opening 620 may each have a polygonal shape with rounded corners.

In FIG. 5, for convenience of description, an example in which the shape, size, and structure of the first mask opening 610 are the same as those of the second mask opening 620 is illustrated. However, the shapes, sizes, and structures of the first mask opening 610 and the second mask opening 620 may be changed according to the shapes, sizes, and structures of the first pixel Pm of the first display area DA1 and the second pixel Pa of the second display area DA2, which emit light of the same color. The size of the first pixel Pm and the second pixel Pa may be the size or area of a pixel electrode or an emission area.

The stability of a distance between the mask openings may affect the quality of the mask M. In particular, in the case of a display device having different display areas, that is, the first display area DA1 and the second display area DA2, it is necessary that a distance Dm between openings of the first display area DA1 and openings of the second display area DA2 at the boundary between the first display area DA1 and the second display area DA2 be greater than or equal to a certain distance. Therefore, it is important to arrange sub-pixels emitting light of the same color at the boundary between the first display area DA1 and the second display area DA2.

Figure 7:
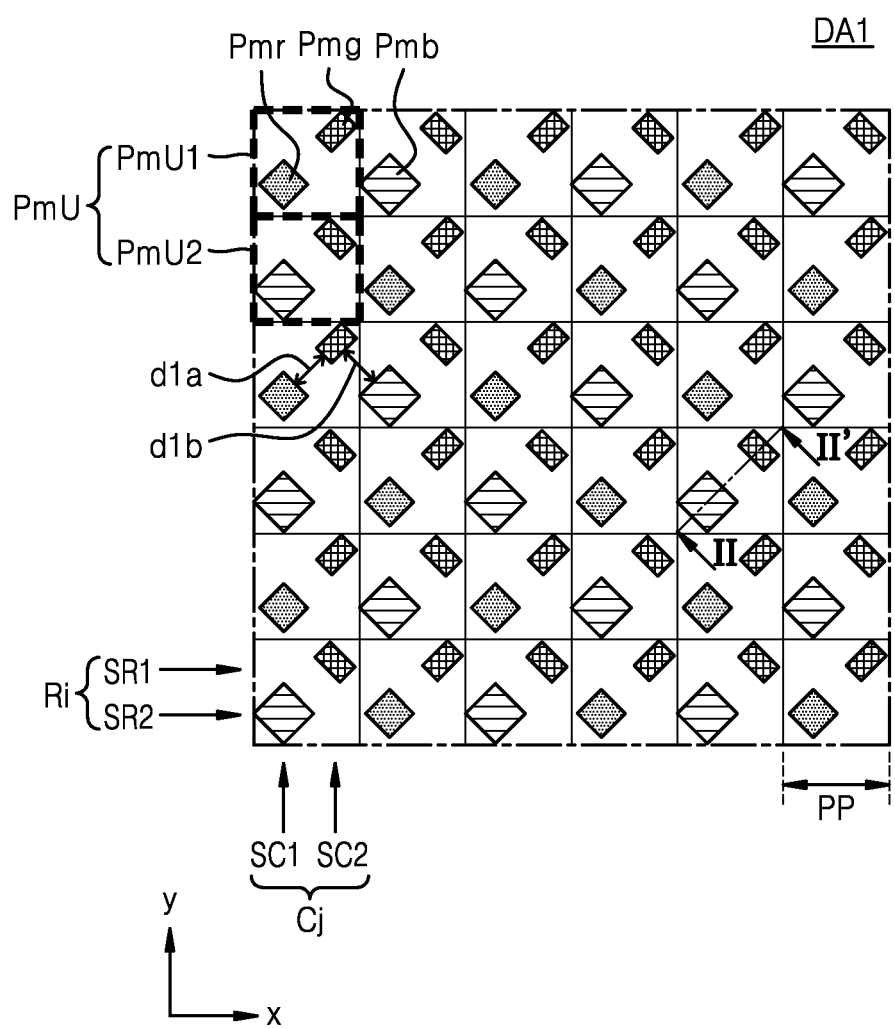
FIG. 7 illustrates a pixel structure in the first display area of FIG. 6.
Figure 8:
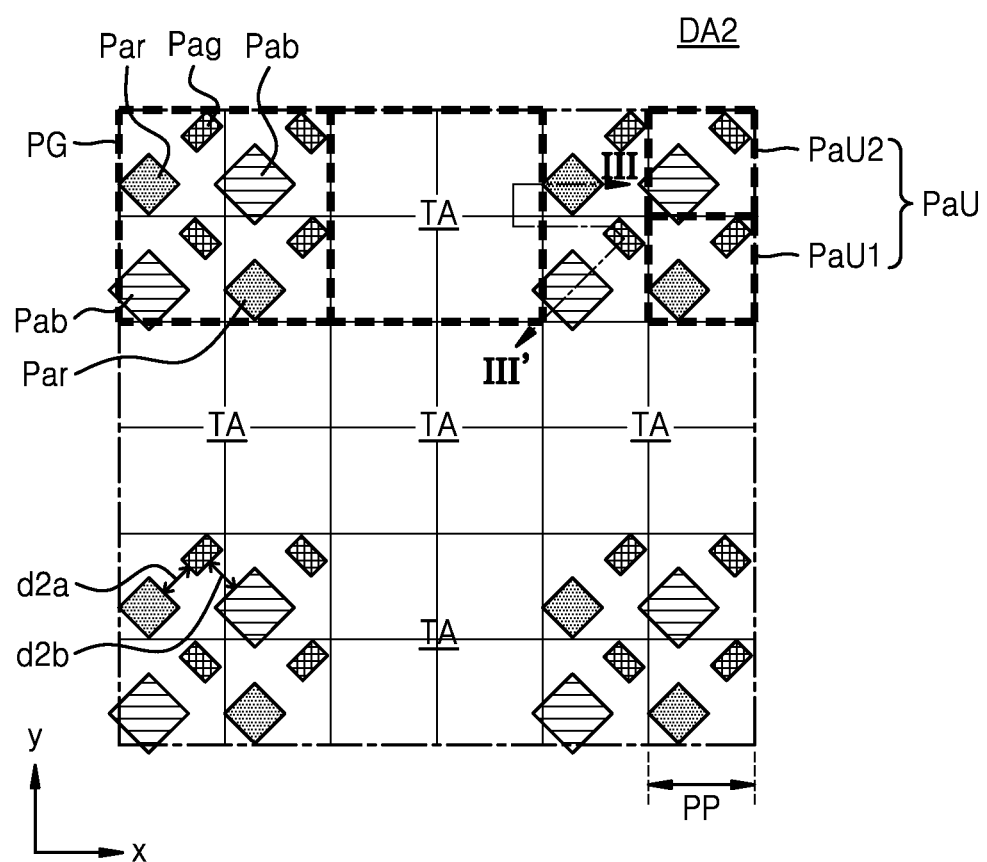
FIG. 8 illustrates a pixel structure in the second display area of FIG. 6.

Hereinafter, in the present embodiment, the first pixel Pm and the second pixel Pa, which correspond to each other, may be sub-pixels emitting light of the same color. For example, a first red pixel Pmr and a second red pixel Par, a first green pixel Pmg and a second green pixel Pag, and a first blue pixel Pmb and a second blue pixel Pab, which are shown in FIGS. 7 and 8, may be sub-pixels corresponding to each other.

In embodiments of the present disclosure, a distance between the first pixel Pm and the second pixel Pa adjacent to a boundary area between the first display area DA1 and the second display area DA2 may be optimized. Thus, defects in the boundary area between the display area DA1 and the second display area DA2 may be reduced. Hereinafter, the distance between the first pixel Pm and the second pixel Pa represents a distance between a first pixel Pm and a second pixel Pa adjacent to the boundary area. The distance between the first pixel Pm and the second pixel Pa may be a distance between a first pixel Pm and a second pixel Pa on a first virtual line parallel to the x-direction or y-direction passing through the center of the second pixel Pa or a second virtual line parallel to the first virtual line.

In an embodiment, when a first virtual line parallel to the x-direction or the y-direction passing through the center of a second pixel Pa adjacent to the boundary area is set, a distance, hereinafter referred to as an 'edge distance', between an edge of a second pixel Pa on the first virtual line and an edge of a first pixel Pm through which the first virtual line first passes may be determined as a certain value. The edge distance may include a first edge distance ED1, e.g., see FIGS. 9 and 15, when a first pixel Pm and a second pixel Pa on the first virtual line are sub-pixels corresponding to each other, and a second edge distance ED2, e.g., see FIG. 15, when a first pixel Pm and a second pixel Pa on the first virtual line are sub-pixels emitting light of different colors. In this case, the edge of a pixel refers to the edge of an emission area.

In an embodiment, when a first virtual line parallel to the x-direction or the y-direction passing through the center of a second pixel Pa adjacent to the boundary area is set, a distance, hereinafter referred to as a center distance CD3 and CD3', e.g., see FIGS. 10 and 16, between centers of a first pixel Pm and a second pixel Pa, which correspond to each other, on the first virtual line or the second virtual line may be determined as a certain value. In this case, the center of a pixel refers to the center of an emission area.

Figure 6:
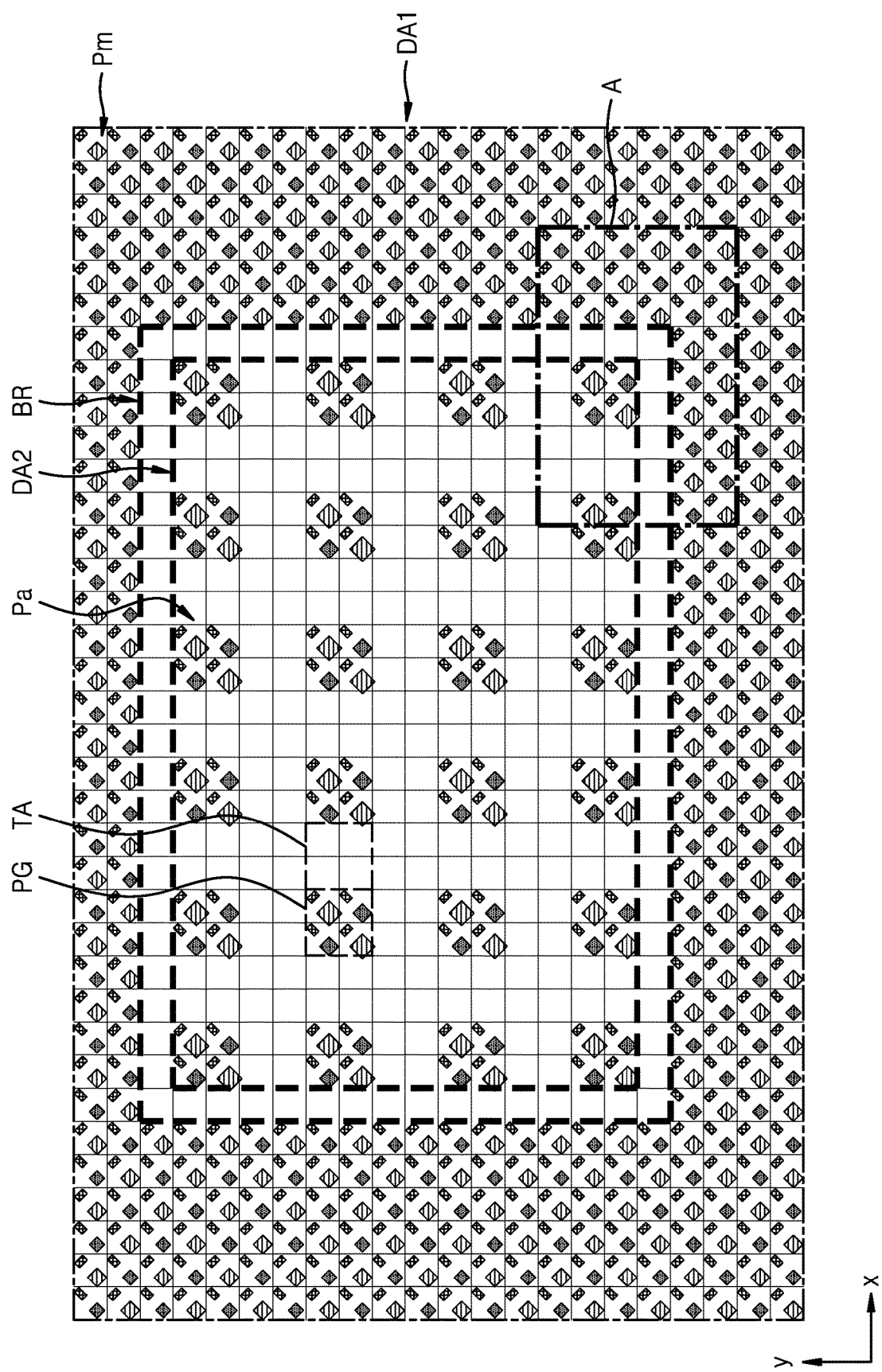
FIG. 6 is a plan view illustrating portions of a first display area and a second display area according to an embodiment.
Figure 9:
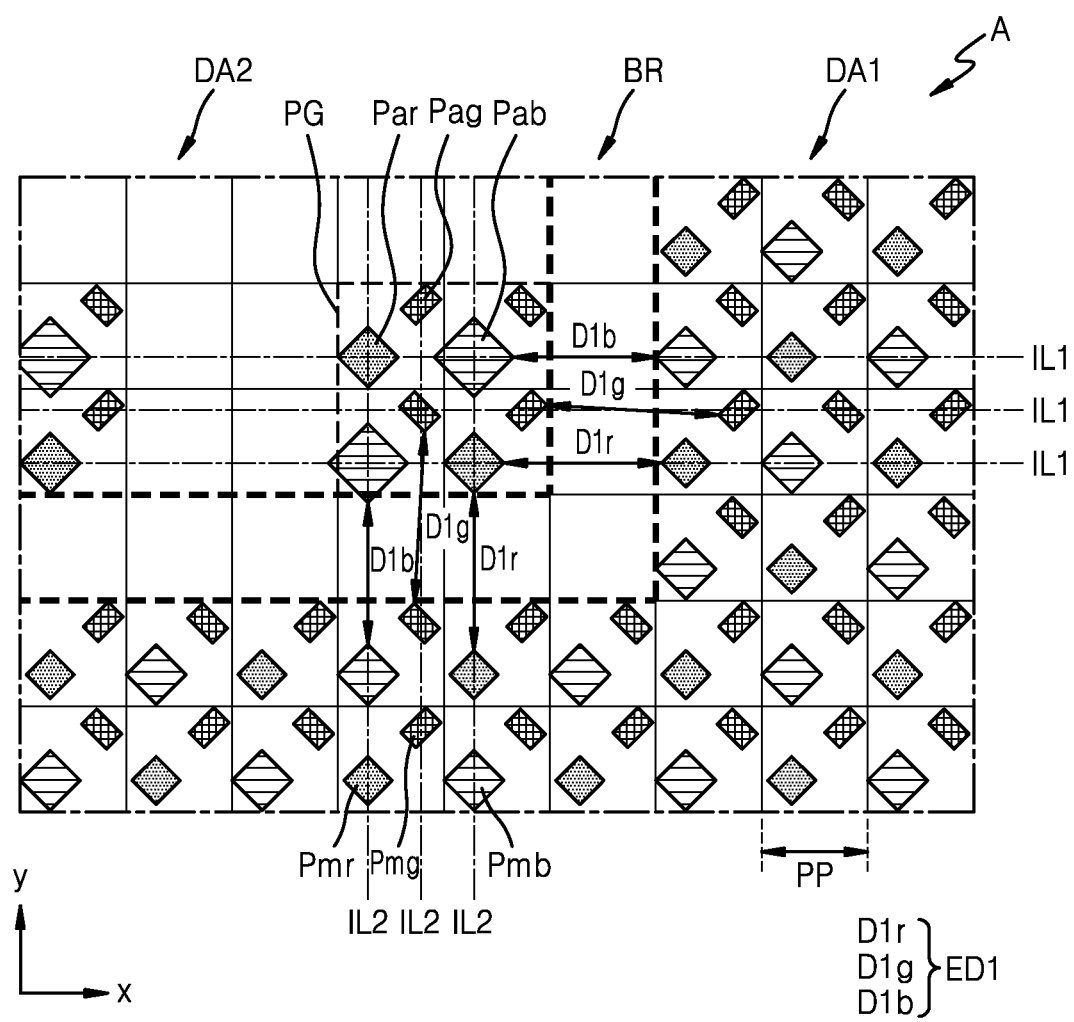
FIGS. 9 and 10 are enlarged views of a portion A of FIG. 6.
Figure 11:
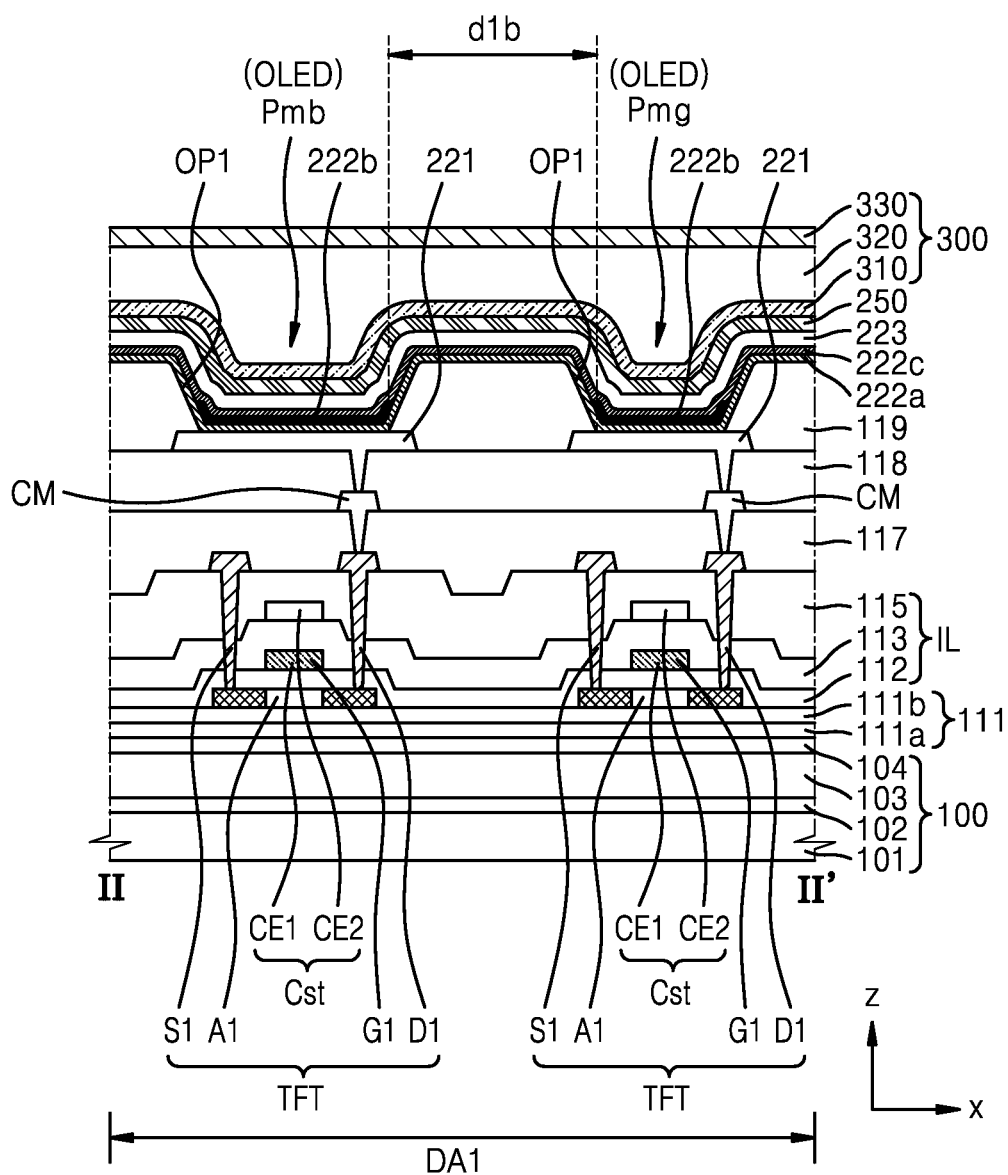
FIG. 11 is a cross-sectional view of a display device taken along line II-II' of FIG. 7.
Figure 12:
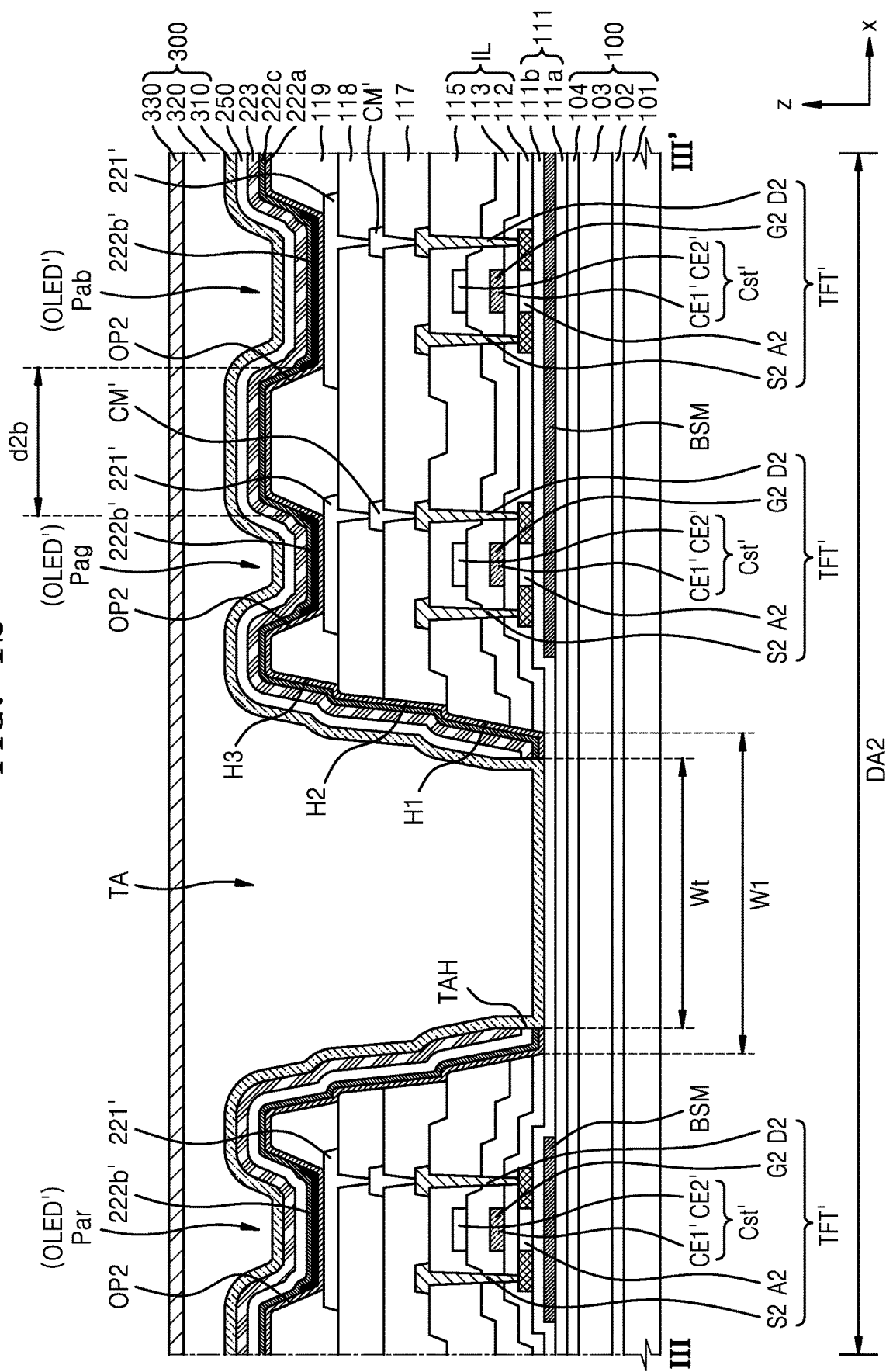
FIG. 12 is a cross-sectional view of a display device taken along line III-III' of FIG. 8.

FIG. 6 is a plan view illustrating portions of first display area DA1 and second display area DA2 according to an embodiment. FIG. 7 illustrates a pixel structure in the first display area DA1. FIG. 8 illustrates a pixel structure in the second display area DA2. FIGS. 9 and 10 are enlarged views of a portion A of FIG. 6. FIG. 11 is a cross-sectional view of the display device taken along line II-II' of FIG. 7. FIG. 12 is a cross-sectional view of the display device taken along line III-III' of FIG. 8.

In the present disclosure, the pixel structure will be described based on an emission area of each sub-pixel. The emission area of the sub-pixel may be defined by an opening of a pixel-defining layer, which will be described later.

Referring to FIG. 6, the first display area DA1 may surround the second display area DA2, and a boundary area BR may be provided between the first display area DA1 and the second display area DA2. The boundary area BR may surround the second display area DA2 and the first display area DA1 may surround the boundary area BR.

Referring to FIG. 7, first pixels Pm may be on the first display area DA1. Each of the first pixels Pm may include a display element such as the organic light-emitting diode OLED. The first pixel Pm may be a sub-pixel that emits red, green, blue, or white light. The first pixels Pm may include the first red pixel Pmr that emits red light, the first green pixel Pmg that emits green light, and the first blue pixel Pmb that emits blue light. The first red pixel Pmr and the first blue pixel Pmb may be larger than the first green pixel Pmg.

First green pixels Pmg may be repeatedly positioned in a first sub-row SR1 of each row Ri, and the first red pixel Pmr and the first blue pixel Pmb may be alternately positioned in a second sub-row SR2. That is, in each row Ri, the first pixels Pm may be repeatedly positioned in the order of the first red pixel Pmr, the first green pixel Pmg, the first blue pixel Pmb, and the first green pixel Pmg in the x-direction. A pixel-defining layer 119, e.g., see FIG. 11, between the first red pixel Pmr and the first green pixel Pmg may have a first width, e.g., gap, d1a, and the pixel-defining layer 119 between the first green pixel Pmg and the first blue pixel Pmb may have a second width d1b.

The first red pixel Pmr and the first blue pixel Pmb may be alternately positioned in a first sub-column SC1 of each column Cj, and the first green pixel Pmg may be repeatedly positioned in a second sub-column SC2.

The first pixels Pm may constitute a pixel unit PmU. Each pixel unit PmU may include at least two first pixels Pm. In an embodiment, a first pixel unit PmU1 may include a first red pixel Pmr and a first green pixel Pmg, and a second pixel unit PmU2 may include a first blue pixel Pmb and a first green pixel Pmg. Each of the pixel units PmU in the first display area DA1 may have a size of a pixel pitch PP. In the present disclosure, the pixel pitch PP may be a center distance between the first green pixels Pmg.

The pixel structure of FIG. 7 is called a pentile matrix structure, and in this case, a high resolution may be realized with a small number of pixels by using a rendering driving scheme that shares adjacent pixels to represent colors.

Although first pixels Pm in a pentile type are illustrated in FIG. 7, the first pixels Pm may be in a stripe shape or various shapes.

Referring to FIG. 8, second pixels Pa may be on the second display area DA2. Each of the second pixels Pa may include a display element such as the organic light-emitting diode OLED'. The second pixel Pa may be a sub-pixel that emits red, green, blue, or white light. The second pixels Pa may include the second red pixel Par that emits red light, the second green pixel Pag that emits green light, and the second blue pixel Pab that emits blue light.

The second display area DA2 may include a pixel group PG including at least one second pixel Pa and a transmission area TA. The pixel group PG and the transmission area TA may be alternately positioned in the x-direction and the y-direction and may be, for example, in a lattice shape. In this case, a plurality of pixel groups PG and a plurality of transmission areas TA may be provided.

The pixel group PG may be defined as a pixel set in which second pixels Pa are grouped in a preset unit. In FIG. 8, the pixel group PG is defined to include eight second pixels Pa. However, the in an embodiment, the number of second pixels Pa in the pixel group PG may be designed to be modified according to the resolution of the second display area DA2.

The structure of the second pixels Pa in the pixel group PG of the second display area DA2 may be the same as the structure of the first pixels Pm of the first display area DA1. In this case, the area, e.g., size, of each of the second pixels Pa may be the same as or different from the area, e.g., size, of each of the first pixels Pm corresponding to the second pixels Pa. The second pixels Pa may constitute pixel units PaU. Each of the pixel units PaU may include at least two second pixels Pa. In an embodiment, a first pixel unit PaU1 may include a second red pixel Par and a second green pixel Pag, and a second pixel unit PaU2 may include a second blue pixel Pab and a second green pixel Pag. Each of the pixel units PaU in the second display area DA2 may have a size of the pixel pitch PP. Each pixel group PG may include two first pixel units PaU1 and two second pixel units PaU2. The pixel-defining layer 119, e.g., see FIG. 12, between the second red pixel Par and the second green pixel Pag may have a third width d2a, and the pixel-defining layer 119 between the second green pixel Pag and the second blue pixel Pab may have a fourth width d2b.

The transmission area TA may be on one side of the pixel group PG. The second pixel Pa may not be in the transmission area TA. That is, a pixel electrode, an intermediate layer, and an opposite electrode, which constitute the organic light-emitting diode OLED', and a pixel circuit electrically connected to the organic light-emitting diode OLED' are not in the transmission area TA. Of course, some of the signal lines PL, DL, SL, and EL, e.g., see FIGS. 4A and 4B, for supplying signals to the second pixel Pa located in the second display area DA2 may be located to cross the transmission area TA. However, even in this case, in order to increase the transmittance of the transmission area TA, the signal lines PL, DL, SL, and EL may be positioned to bypass a central portion of the transmission area TA and to be biased on one side.

Referring back to FIG. 6, in the first display area DA1, first pixel units PmU1 and second pixel units PmU2 may be alternately positioned in the x-direction and the y-direction. In the second display area DA2, the pixel group PG may be repeatedly positioned at certain intervals in the x-direction and the y-direction. The transmission area TA may be between the pixel groups PG, and the transmission area TA may surround the pixel group PG. The transmission area TA may be located in the boundary area BR, and the first pixels Pm may surround the boundary area BR. In FIG. 6, the boundary area BR is illustrated as an area between the first display area DA1 and the second display area DA2. However, the boundary area BR may be a portion of the second display area DA2, that is, a transmission area TA of the second display area DA2.

In FIG. 6, transmission areas TA surround the pixel group PG. However, in an embodiment, transmission areas TA and pixel groups PG may be staggered in a lattice shape.

In FIG. 6, the second pixel Pa is larger than the first pixel Pm. However, in an embodiment, the first pixel Pm may be larger than the second pixel Pa, or the first pixel Pm and the second pixel Pa may have the same size.

Referring to FIG. 9, when a first pixel Pm on a first virtual line IL1 extending parallel to the x-direction, e.g., extending parallel to a scan line, or a first virtual line IL2 extending parallel to the y-direction, e.g., extending parallel to a data line, is a sub-pixel corresponding to a second pixel Pa, the first edge distance ED1 may be greater than or equal to the pixel pitch PP. The first edge distance ED1 may be the shortest straight distance between the edges of a first pixel Pm and a second pixel Pa, which correspond to each other. For example, as shown in FIG. 9, the first edge distance ED1 between the first pixel Pm and the second pixel Pa may be a distance between facing vertices of a first pixel Pm and a second pixel Pa, which correspond to each other. A first edge distance D1r between a second red pixel Par and a first red pixel Pmr, which are adjacent to the boundary area BR, on the first virtual line IL1 or IL2 may be greater than or equal to the pixel pitch PP. A first edge distance D1g between a second green pixel Pag and a first green pixel Pmg, which are adjacent to the boundary area BR, on the first virtual line IL1 or IL2 may be greater than or equal to the pixel pitch PP. In addition, a first edge distance D1b between a second blue pixel Pab and a first blue pixel Pmb, which are adjacent to the boundary area BR, on the first virtual line IL1 or IL2 may be greater than or equal to the pixel pitch PP.

Figure 10:
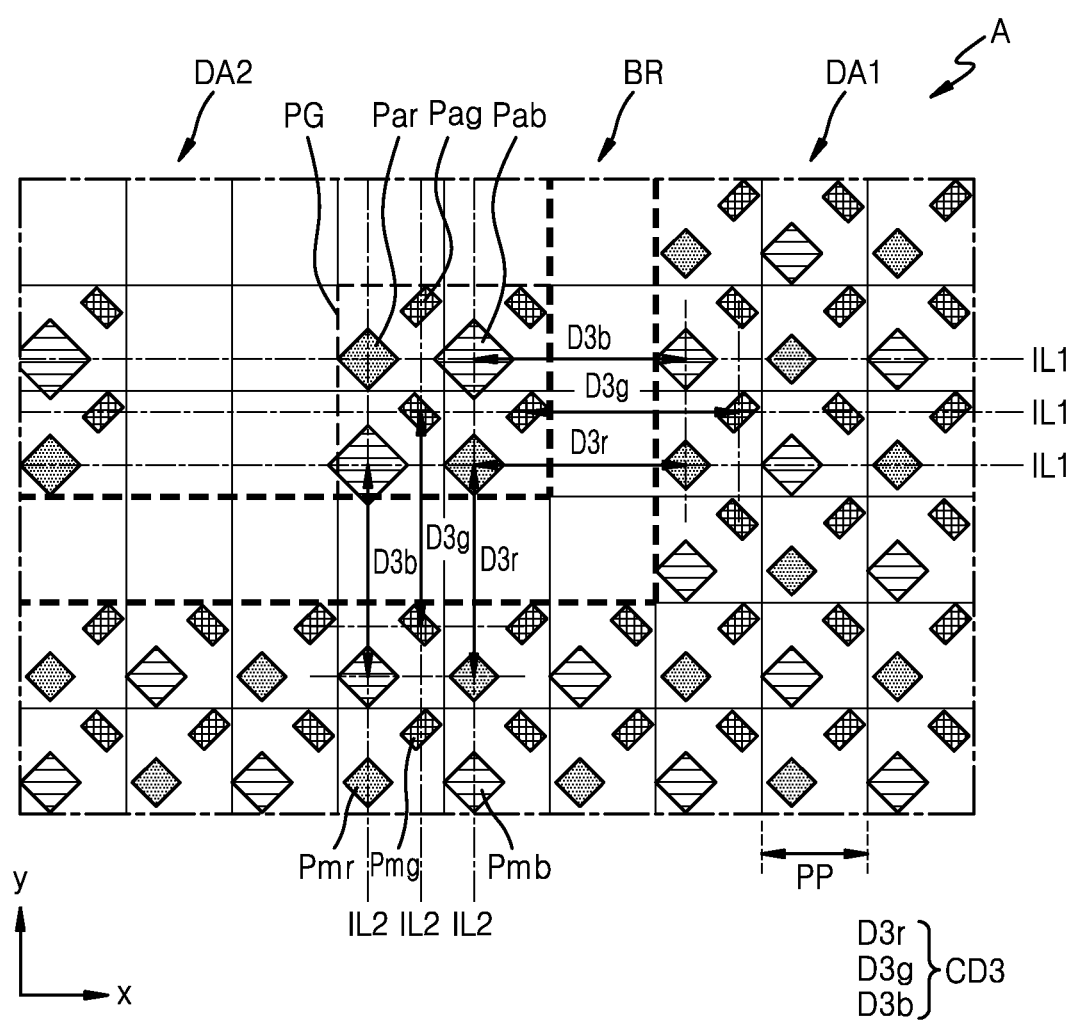

Referring to FIG. 10, a center distance CD3 between centers of a first pixel Pm and a second pixel Pa, which correspond to each other, on the first virtual line IL1 extending parallel to the x-direction or the first virtual line IL2 extending parallel to the y-direction may be within ±30% of twice the pixel pitch PP ((PP×2×0.7)<CD3<(PP×2×1.3)). The center distance CD3 between a first pixel Pm and a second pixel Pa, which correspond to each other, on the first virtual line IL1 may be the shortest straight line distance between a line passing through the center of the first pixel Pm in the y-direction and a line passing through the center of the second pixel Pa in the y-direction. The center distance CD3 between a first pixel Pm and a second pixel Pa, which correspond to each other, on the first virtual line IL2 may be the shortest straight line distance between a line passing through the center of the first pixel Pm in the x-direction and a line passing through the center of the second pixel Pa in the x-direction.

A center distance D3r between a second red pixel Par and a first red pixel Pmr, which are adjacent to the boundary area BR, on the first virtual line IL1 or IL2 may be within ±30% of twice the pixel pitch PP. A center distance D3g between a second green pixel Pag and a first green pixel Pmg, which are adjacent to the boundary area BR, on the first virtual line IL1 or IL2 may be within ±30% of twice the pixel pitch PP. In addition, a center distance D3b between a second blue pixel Pab and a first blue pixel Pmb, which are adjacent to the boundary area BR, on the first virtual line IL1 or IL2 may be within ±30% of twice the pixel pitch PP.

The first pixel Pm may include a first organic light-emitting diode OLED and may be connected to a pixel circuit including a first thin-film transistor TFT and a first capacitor Cst. The second pixel Pa may include a second organic light-emitting diode OLED' and may be connected to a pixel circuit including a second thin-film transistor TFT' and a second capacitor Cst'. The metal layer BSM may be under the second thin-film transistor TFT' of the second pixel Pa to overlap the second thin-film transistor TFT'.

Hereinafter, a structure in which components in the display device 1 according to an embodiment are stacked will be described with reference to FIGS. 11 and 12.

The substrate 100 may include a polymer resin. The substrate 100 may include a base layer including a polymer resin, and an inorganic layer. In an embodiment, the substrate 100 may include a first base layer 101, a first inorganic layer 102, a second base layer 103, and a second inorganic layer 104, which are sequentially stacked.

Each of the first base layer 101 and the second base layer 103 may include a polymer resin. For example, each of the first base layer 101 and the second base layer 103 may include a polymer resin, such as polyethersulfone (PES), polyarylate (PAR), polyetherimide (PEI), polyethyelenene naphthalate (PEN), polyethylene terephthalide (PET), polyphenylene sulfide (PPS), polyimide (PI), polycarbonate (PC), cellulose triacetate (TAC), cellulose acetate propionate (CAP), or the like. The polymer resin may be transparent.

Each of the first inorganic layer 102 and the second inorganic layer 104 is a barrier layer that prevents the penetration of foreign matter, and may include a single layer or multiple layers including inorganic materials such as silicon nitride $SiN_x$ and/or silicon oxide $SiO_x$.

A buffer layer 111 may be located on the substrate 100 and reduce or block infiltration of foreign matter, moisture, or external air from below the substrate 100 and may provide a flat surface on the substrate 100. The buffer layer 111 may include an inorganic material, e.g., such as oxide or nitride, an organic material, or an organic and inorganic compound, and may be formed as a single layer or multiple layers of an inorganic material and an organic material. A barrier layer may be between the substrate 100 and the buffer layer 111 in order to prevent infiltration of ambient air. In some embodiments, the buffer layer 111 may include silicon nitride ($SiN_x$) or silicon oxide ($SiO_x$). The buffer layer 111 may be provided such that a first buffer layer 111a and a second buffer layer 111b are stacked.

In the second display area DA2, the metal layer BSM may be between the first buffer layer 111a and the second buffer layer 111b. In an embodiment, the metal layer BSM may be between the substrate 100 and the first buffer layer 111a. The metal layer BSM may be under a pixel circuit to overlap the pixel circuit and may prevent deterioration of characteristics of a thin-film transistor due to light emitted from the component 20 and the like. The metal layer BSM may have an area corresponding to the pixel group PG.

In addition, the metal layer BSM may be connected to a wiring line on another layer through a contact hole and receive a constant voltage, e.g., the power supply voltage ELVDD or the initialization voltage VINT, or a signal, e.g., the scan signal, from the wiring line. The metal layer BSM may receive the constant voltage or the signal and thus the probability of generating an electrostatic discharge may be significantly reduced. The metal layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The metal layer BSM may include a single layer or multiple layers of the aforementioned material.

A first thin-film transistor TFT and the second thin-film transistor TFT' may be on the buffer layer 111. The first thin-film transistor TFT may include a first semiconductor layer A1, a first gate electrode G1, a first source electrode S1, and a first drain electrode D1. The second thin-film transistor TFT' may include a second semiconductor layer A2, a second gate electrode G2, a second source electrode S2, and a second drain electrode D2. The first thin-film transistor TFT may be connected to a first organic light-emitting diode OLED to drive the first organic light-emitting diode OLED. The second thin-film transistor TFT' may be connected to a second organic light-emitting diode OLED' to drive the second organic light-emitting diode OLED'.

The first semiconductor layer A1 and the second semiconductor layer A2 may be on the buffer layer 111 and may include polysilicon. In an embodiment, each of the first semiconductor layer A1 and the second semiconductor layer A2 may include amorphous silicon. In an embodiment, the first semiconductor layer A1 and the second semiconductor layer A2 may each include an oxide of at least one material selected from indium (In), gallium (Ga), stanium (Sn), zirconium (Zr), vanadium (V), hafnium (Hf), cadmium (Cd), germanium (Ge), chromium (Cr), titanium (Ti), and zinc (Zn). Each of the first semiconductor layer A1 and the second semiconductor layer A2 may include a channel region, and a source region and a drain region doped with impurities.

The second semiconductor layer A2 may overlap the metal layer BSM with the buffer layer 111 between the second semiconductor layer A2 and the metal layer BSM. In an embodiment, the width of the second semiconductor layer A2 may be less than the width of the metal layer BSM. Thus, when projected in a direction perpendicular to the substrate 100, the second semiconductor layer A2 may overlap the metal layer BSM as a whole.

A first gate insulating layer 112 may be provided to cover the first semiconductor layer A1 and the second semiconductor layer A2. The first gate insulating layer 112 may include an inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the aforementioned inorganic insulating material.

The first gate electrode G1 and the second gate electrode G2 are on the first gate insulating layer 112 to overlap the first semiconductor layer A1 and the second semiconductor layer A2, respectively. Each of the first gate electrode G1 and the second gate electrode G2 may include Mo, Al, Cu, Ti, or the like and include a single layer or multiple layers. For example, each of the first gate electrode G1 and the second gate electrode G2 may include a single layer including Mo.

A second gate insulating layer 113 may be provided to cover the first gate electrode G1 and the second gate electrode G2. The second gate insulating layer 113 may include an inorganic insulating material, such as $SiO_x$, $SiN_x$, SiON, $Al_2O_3$, $TiO_2$, $Ta_2O_5$, $HfO_2$, or $ZnO_2$. The second gate insulating layer 113 may include a single layer or multiple layers including the aforementioned inorganic insulating material.

A first upper electrode CE2 of the first capacitor Cst and a second upper electrode CE2' of the second capacitor Cst' may be on the second gate insulating layer 113.

In the first display area DA1, the first upper electrode CE2 may overlap the first gate electrode G1 under the first upper electrode CE2. The first gate electrode G1 and the first upper electrode CE2 overlapping each other with the second gate insulating layer 113 between the first gate electrode G1 and the first upper electrode CE2 may form the first capacitor Cst. The first gate electrode G1 may be the first lower electrode CE1 of the first capacitor Cst.

In the second display area DA2, the second upper electrode CE2' may overlap the second gate electrode G2 under the second upper electrode CE2'. The second gate electrode G2 and the second upper electrode CE2' overlapping each other with the second gate insulating layer 113 between the second gate electrode G2 and the second upper electrode CE2' may form the second capacitor Cst'. The second gate electrode G2 may be the second lower electrode CE1' of the second capacitor Cst'.

Each of the first upper electrode CE2 and the second upper electrode CE2' may include Al, Pt, Pd, Ag, Mg, Au, Ni, Nd, Ir, Cr, Li, Ca, Mo, Ti, W, or Cu and may include a single layer or multiple layers of the aforementioned material.

An interlayer insulating layer 115 may be formed to cover the first upper electrode CE2 and the second upper electrode CE2'. The interlayer insulating layer 115 may include $SiO_x$, $SiN_x$, SiON, $Al_2O_3$, $TiO_2$, $Ta_2O_5$, $HfO_2$, $ZnO_2$, or the like.

When the first gate insulating layer 112, the second gate insulating layer 113, and the interlayer insulating layer 115 are collectively referred to as an inorganic insulating layer IL, the inorganic insulating layer IL may have a first hole H1 corresponding to the transmission area TA. The first hole H1 may be formed to extend to and expose the upper surface of the buffer layer 111 or the substrate 100. The first hole H1 may be formed by overlapping openings of the first gate insulating layer 112, the second gate insulating layer 113, and the interlayer insulating layer 115 formed to correspond to the transmission area TA. The openings may be respectively formed through separate processes or may be simultaneously formed through the same process. When the openings are respectively formed through separate processes, a step may be formed on the inner surface of the first hole H1.

In an embodiment, the inorganic insulating layer IL may be provided with grooves other than the first hole H1 exposing the buffer layer 111.

In an embodiment, the inorganic insulating layer IL may not have the first hole H1 corresponding to the transmission area TA. Because the inorganic insulating layer IL generally includes an inorganic insulating material having excellent light transmittance, the inorganic insulating layer may implement a transmittance of light that may be transmitted/received by the component 20, e.g., refer to FIG. 2, even without a hole corresponding to the transmission area TA.

The first and second source electrodes S1 and S2 and the first and second drain electrodes D1 and D2 may be on the interlayer insulating layer 115. The first and second source electrodes S1 and S2 and the first and second drain electrodes D1 and D2 may each include a conductive material including Mo, Al, Cu, Ti, or the like and may be formed as a single layer or multiple layers including the conductive material. For example, the first and second source electrodes S1 and S2 and the first and second drain electrodes D1 and D2 may each have a multi-layered structure of Ti/Al/Ti.

A first planarization layer 117 may cover the first and second source electrodes S1 and S2 and the first and second drain electrodes D1 and D2. The first planarization layer 117 may have a flat upper surface such that a first pixel electrode 221 and a second pixel electrode 221', which are on the first planarization layer 117, are formed flat.

A second planarization layer 118 may be on the first planarization layer 117. Contact metal layers CM and CM' may be between the first planarization layer 117 and the second planarization layer 118. The contact metal layers CM and CM' may electrically connect the first and second drain electrodes D1 and D2 to the first and second pixel electrodes 221 and 221' through contact holes formed in the first planarization layer 117 and the second planarization layer 118, respectively.

Each of the first planarization layer 117 and the second planarization layer 118 may be formed as a single layer or multiple layers including an organic material or an inorganic material. Each of the first planarization layer 117 and the second planarization layer 118 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. Each of the first planarization layer 117 and the second planarization layer 118 may include $SiO_x$, $SiN_x$, SiON, $Al_2O_3$, $TiO_2$, $Ta_2O_5$, $HfO_2$, $ZnO_2$, or the like. After the first and second planarization layers 117 and 118 are formed, chemical mechanical polishing may be performed to provide a flat top surface of the first and second planarization layers 117 and 118.

The first and second planarization layers 117 and 118 may have a second hole H2 corresponding to the transmission area TA. The second hole H2 may overlap the first hole H1. FIGS. 11 and 12 illustrate examples in which the second hole H2 is larger than the first hole H1. However, the first and second planarization layers 117 and 118 may be provided to cover an edge of the first hole H1 of the inorganic insulating layer IL, and thus, the width of the second hole H2 may be less than the width of the first hole H1.

Each of the first planarization layer 117 and the second planarization layer 118 has a contact hole that exposes one of the first source electrode S1 and the first drain electrode D1 of the first thin-film transistor TFT, and the first pixel electrode 221 may contact the first source electrode S1 or the first drain electrode D1 through the contact hole and be electrically connected to the first thin-film transistor TFT.

In addition, each of the first planarization layer 117 and the second planarization layer 118 has a contact hole that exposes one of the second source electrode S2 and the second drain electrode D2 of the second thin-film transistor TFT', and the second pixel electrode 221' may contact the second source electrode S2 or the second drain electrode D2 through the contact hole and be electrically connected to the second thin-film transistor TFT'.

Each of the first pixel electrode 221 and the second pixel electrode 221' may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, each of the first pixel electrode 221 and the second pixel electrode 221' may include a reflective layer including Ag, Mg, Al, Pt, Pd, Au, Ni, Nd, Ir, Cr, or a compound thereof. In an embodiment, each of the first pixel electrode 221 and the second pixel electrode 221' may further include a layer including ITO, IZO, ZnO, or In203 above or below the reflective layer. In some embodiments, each of the first pixel electrode 221 and the second pixel electrode 221' may have a stacked structure of ITO/Ag/ITO.

The pixel-defining layer 119 may cover the edge of each of the first pixel electrode 221 and the second pixel electrode 221'. The pixel-defining layer 119 may overlap each of the first electrode 221 and the second pixel electrode 221', and may include a first opening OP1 and a second opening OP2, which define a light-emitting area of a pixel. The pixel-defining layer 119 may increase the distance between the edges of the first and second pixel electrodes 221 and 221' and an opposite electrode 223 on the first and second pixel electrodes 221 and 221', thereby preventing the occurrence of arcs in the edges of the first and second pixel electrodes 221 and 221'. The pixel-defining layer 119 may include an organic insulating material such as polyimide, polyamide, acrylic resin, BCB, HMDSO, or phenol resin and may be formed by spin coating or the like.

The pixel-defining layer 119 may have a third hole H3 located in the transmission area TA. The third hole H3 may overlap the first hole H1 and the second hole H2. As the first to third holes H1, H2, and H3 are formed, light transmittance of the transmission area TA may be improved. An opposite electrode 223 to be described later may be on the inner walls of the first to third holes H1, H2, and H3.

A first functional layer 222a covers the pixel-defining layer 119. The first functional layer 222a may include a single layer or multiple layers. The first functional layer 222a may be a hole transport layer (HTL) having a single layer structure. Alternatively, the first functional layer 222a may include a hole injection layer (HIL) and an HTL. The first functional layer 222a may be integrally formed to correspond to the first pixels Pm in the first display area DA1 and the second pixels Pa in the second display area DA2.

A first emission layer 222b and a second emission layer 222b' formed to correspond to the first pixel electrode 221 and the second pixel electrode 221', respectively, are on the first functional layer 222a. Each of the first emission layer 222b and the second emission layer 222b' may include a polymer material or a low molecular material and may emit red, green, blue, or white light.

A second functional layer 222c may be formed on the first and second emission layers 222b and 222b'. The second functional layer 222c may include a single layer or multiple layers. The second functional layer 222c may include an electron transport layer (ETL) and/or an electron injection layer (EIL). The second functional layer 222c may be integrally formed to correspond to the first pixels Pm in the first display area DA1 and the second pixels Pa in the second display area DA2. In an embodiment, the first functional layer 222a and the second functional layer 222c may be omitted.

The opposite electrode 223 is on the second functional layer 222c. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or In$_2$O$_3$ on the (semi) transparent layer including the aforementioned material. The opposite electrode 223 may be integrally formed to correspond to the first pixels Pm in the first display area DA1 and the second pixels Pa in the second display area DA2.

Layers from the first pixel electrode 221 in the first display area DA1 to the opposite electrode 223 may form the first organic light-emitting diode OLED. Layers from the second pixel electrode 221' in the second display area DA2 to the opposite electrode 223 may form the second organic light-emitting diode OLED'.

A capping layer 250 may be formed on the opposite electrode 223. The capping layer 250 may include LiF. Alternatively, the capping layer 250 may include an inorganic insulating material such as SiN$_x$ and/or an organic material. In some embodiments, the capping layer 250 may be omitted.

In the present embodiment, the first functional layer 222a, the second functional layer 222c, the opposite electrode 223, and the capping layer 250 may have a transmission hole TAH corresponding to the transmission area TA. That is, the first functional layer 222a, the second functional layer 222c, the opposite electrode 223, and the capping layer 250 may respectively have openings corresponding to the transmission area TA. In an embodiment, the widths of the openings forming the transmission hole TAH may be substantially equal to each other. For example, the width of the opening of the opposite electrode 223 may be substantially equal to the width of the transmission hole TAH.

That the transmission hole TAH corresponds to the transmission area TA may mean that the transmission hole TAH overlaps the transmission area TA. In this case, the area of the transmission hole TAH may be less than the area of a first hole H1 formed in the inorganic insulating layer IL. To this end, in FIG. 12, a width Wt of the transmission hole TAH is less than a width W1 of the first hole H1. Here, the area of the transmission hole TAH and the area of the first hole H1 may be defined as the area of a narrowest opening.

As the transmission hole TAH is provided, a portion of the opposite electrode 223 is removed from the transmission area TA. Thus, the light transmittance of the transmission area TA may be significantly increased. The opposite electrode 223 located in the transmission area TA may be formed by removing an area corresponding to the transmission area TA through laser lift-off and may be formed through FMM (Fine Metal Mask) patterning.

The first organic light-emitting diode OLED and the second organic light-emitting diode OLED' may be sealed by a thin-film encapsulation layer 300. The thin-film encapsulation layer 300 may be on the capping layer 250. The thin-film encapsulation layer 300 may prevent external moisture or foreign matter from infiltrating into the first organic light-emitting diode OLED and the second organic light-emitting diode OLED'.

The thin-film encapsulation layer 300 may include at least one inorganic encapsulation layer and at least one organic encapsulation layer. In this regard, FIGS. 11 and 12 illustrate structures in which the thin-film encapsulation layer 300 includes a first inorganic encapsulation layer 310, an organic encapsulation layer 320, and a second inorganic encapsulation layer 330 which are sequentially stacked. In an embodiment, the number of organic encapsulation layers, the number of inorganic encapsulation layers, and the stacking order may be changed.

Each of the first inorganic encapsulation layer 310 and the second inorganic encapsulation layer 330 may include one or more inorganic insulating materials, such as aluminum oxide, titanium oxide, tantalum oxide, hafnium oxide, zinc oxide, silicon oxide, silicon nitride, and/or silicon oxynitride, and may be formed by chemical vapor deposition (CVD). The organic encapsulation layer 320 may include a polymer-based material. Examples of the polymer-based material may include silicon-based resin, acryl-based resin, epoxy-based resin, polyimide, and polyethylene.

The first inorganic encapsulation layer 310, the organic encapsulation layer 320, and the second inorganic encapsulation layer 330 may be integrally formed to cover the first display area DA1 and the second display area DA2. Accordingly, the first inorganic encapsulation layer 310, the organic encapsulation layer 320, and the second inorganic encapsulation layer 330 may be in the transmission hole TAH.

In an embodiment, the organic encapsulation layer 320 may be integrally formed to cover the first display area DA1 and the second display area DA2, but may not be in the transmission area TA. In other words, the organic encapsulation layer 320 may include an opening corresponding to the transmission area TA. In this case, the first inorganic encapsulation layer 310 and the second inorganic encapsulation layer 330 may contact each other within the transmission hole TAH.

The display device shown in FIG. 6 is an example in which the pixel structure of the first display area DA1 and the pixel structure of the second display area DA2 are the same. In an embodiment, the pixel structure of the first display area DA1 may be different from the pixel structure of the second display area DA2.

Figure 13:
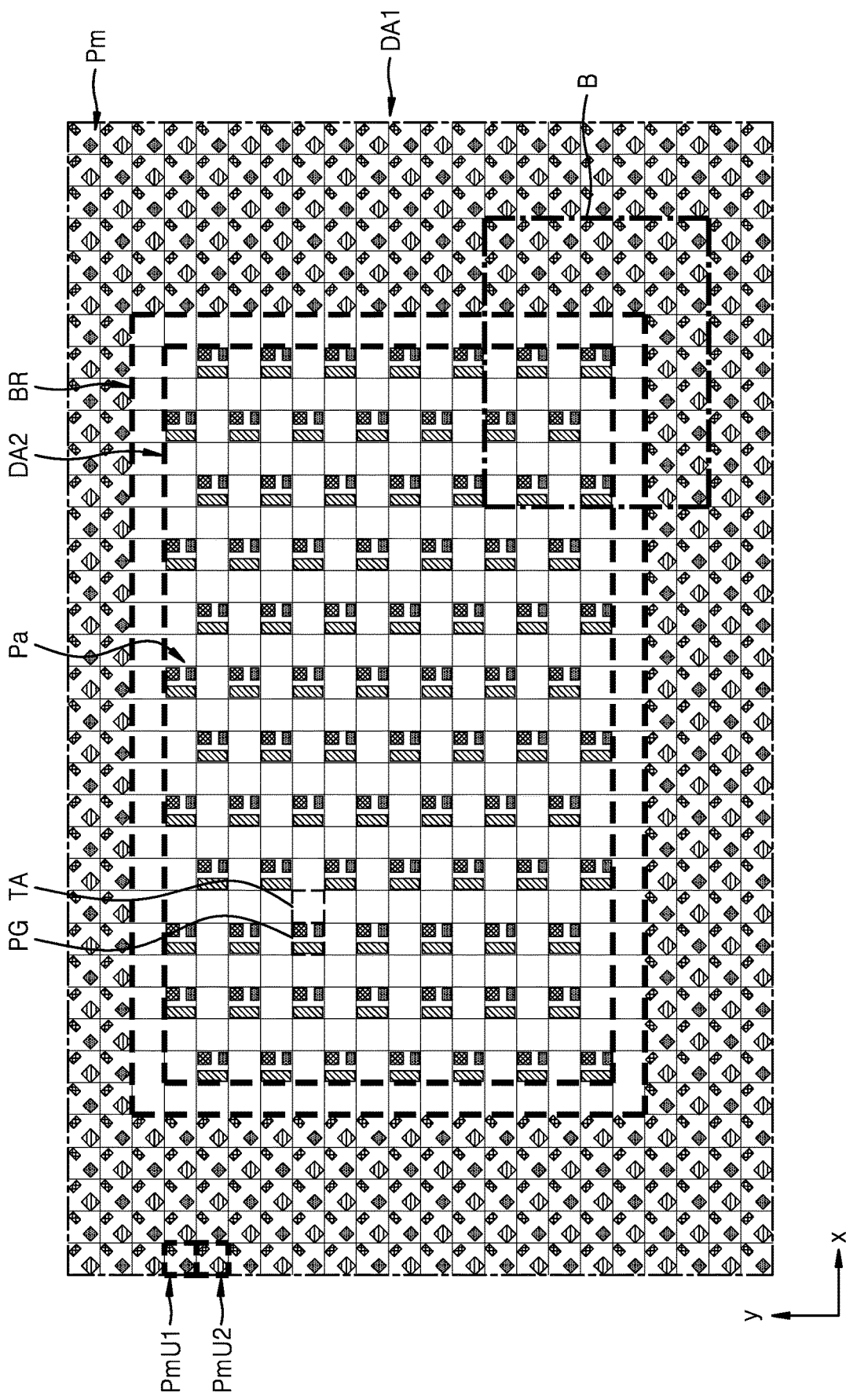
FIG. 13 is a plan view illustrating portions of a first display area and a second display area according to an embodiment.
Figure 14A:
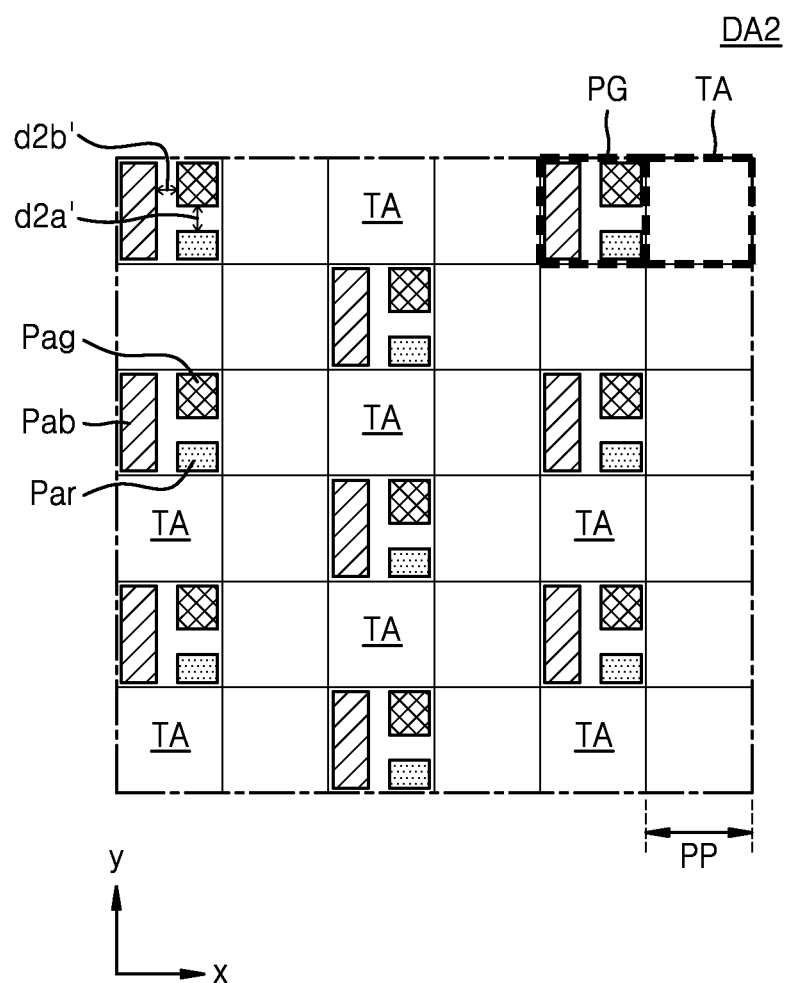
FIGS. 14A and 14B illustrate pixel structures in the second display area of FIG. 13.
Figure 14B:
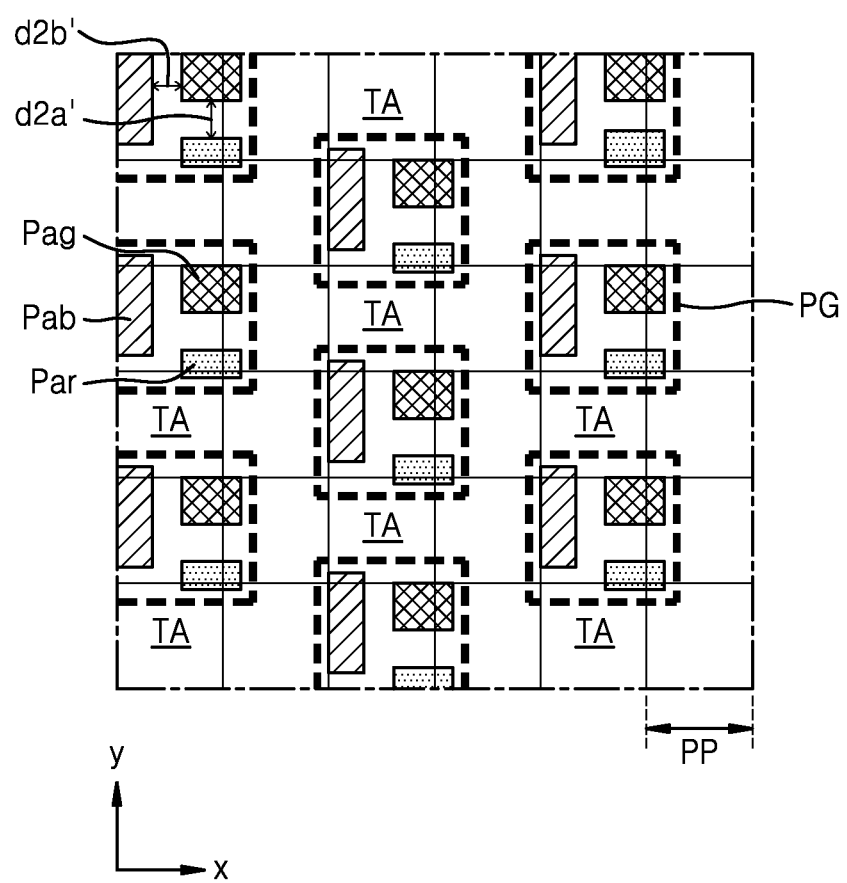
Figure 15:
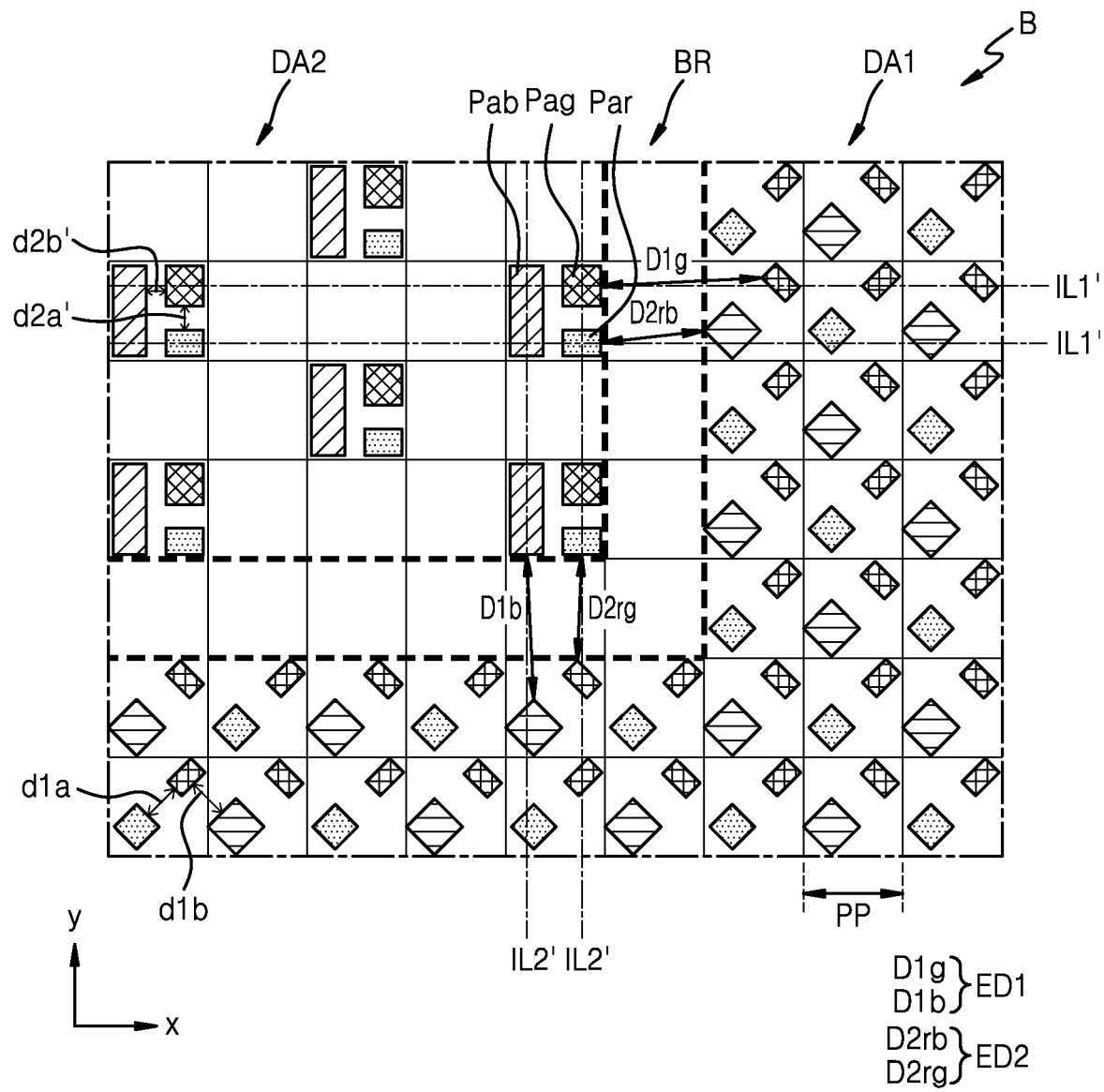
FIGS. 15, 16, and 17 are enlarged views of a portion B of FIG. 13.

FIG. 13 is a plan view illustrating portions of a first display area DA1 and a second display area DA2 according to an embodiment. FIGS. 14A and 14B illustrate pixel structures in the second display area DA2. FIGS. 15, 16, and 17 are enlarged views of a portion B of FIG. 13.

As shown in FIG. 13, the first display area DA1 may surround the second display area DA2, and a boundary area BR may be provided between the first display area DA1 and the second display area DA2. The boundary area BR may surround the second display area DA2 and the first display area DA1 may surround the boundary area BR. The pixel structure of the first display area DA1 is the same as the pixel structure shown in FIG. 7.

Referring to FIG. 14A, second pixels Pa may be on the second display area DA2. Each of the second pixels Pa may include a display element such as the organic light-emitting diode OLED'. The second pixel Pa may be a sub-pixel that emits red, green, blue, or white light. The second pixels Pa may include a second red pixel Par that emits red light, a second green pixel Pag that emits green light, and a second blue pixel Pab that emits blue light.

The second display area DA2 may include a pixel group PG including at least one second pixel Pa and a transmission area TA. The pixel group PG and the transmission area TA may be alternately positioned in the x-direction and the y-direction and may be, for example, in a lattice shape. In this case, a plurality of pixel groups PG and a plurality of transmission areas TA may be provided. The transmission areas TA may surround the pixel group PG.

The pixel group PG may include three second pixels Pa. Each pixel group PG may include a second red pixel Par, a second green pixel Pag, and a second blue pixel Pab. One second blue pixel Pab may be provided to correspond to one second red pixel Par and one second green pixel Pag. Thus, the size of the second blue pixel Pab may be greater than the sizes of the second red pixel Par and the second green pixel Pag. The length of the second blue pixel Pab in the y-direction may be equal to or greater than the sum of the length of the second red pixel Par in the y-direction and the length of the second green pixel Pag in the y-direction. Such a pixel structure is called an S-stripe structure.

A pixel-defining layer 119, e.g., see FIG. 12, between the second red pixel Par and the second green pixel Pag may have a fifth width $d2a'$, and the pixel-defining layer 119 between the second green pixel Pag and the second blue pixel Pab may have a sixth width $d2b'$.

In FIG. 14A, the second pixels Pa in the pixel group PG are within the width of a pixel pitch PP. However, as shown in FIG. 14B, the second pixels Pa in the pixel group PG may be within a width greater than that of the pixel pitch PP.

Referring back to FIG. 13, first pixel units PmU1 and second pixel units PmU2 may be alternately positioned in the x-direction and the y-direction in the first display area DA1. In the second display area DA2, the pixel group PG may be repeatedly positioned at certain intervals in the x direction and the y direction. The transmission area TA may be between the pixel groups PG, and the transmission area TA may surround the pixel group PG. The transmission area TA may be located in the boundary area BR, and the first pixels Pm may surround the boundary area BR. In FIG. 13, the boundary area BR is illustrated as an area between the first display area DA1 and the second display area DA2. However, the boundary area BR may be a portion of the second display area DA2, that is, a transmission area TA of the second display area DA2.

Referring to FIGS. 13 and 15 together, when a first pixel Pm on a first virtual line IL1' extending parallel to the x-direction or a first virtual line IL2' extending parallel to the y-direction is a sub-pixel corresponding to a second pixel Pa, a first edge distance ED1 may be greater than or equal to the pixel pitch PP.

When a first pixel Pm on a first virtual line IL1' extending parallel to the x-direction or a first virtual line IL2' extending parallel to the y-direction is a sub-pixel that emits light of different color than the second pixel Pa, a second edge distance ED2 may be greater than or equal to a minimum value of the width, e.g., gap or interval, of the pixel-defining layer 119 between the first pixels Pm and the width, e.g., gap or interval, of the pixel-defining layer 119 between the second pixels Pa. The second edge distance ED2 may be equal to a minimum value among the first and second widths $d1a$ and $d1b$ and the fifth and sixth widths $d2a'$ and $d2b'$, or a value greater than the minimum value.

In FIG. 15, a first pixel on the first virtual line IL1' or IL2', with respect to each of the second green pixel Pag and the second blue pixel Pab, is a corresponding sub-pixel, that is, the first green pixel Pmg and the first blue pixel Pmb. Accordingly, a first edge distance $D1g$ and a first edge distance $D1b$, which are greater than or equal to the pixel pitch PP, may be respectively set between the second green pixel Pag and the first green pixel Pmg and between the second blue pixel Pab and the first blue pixel Pmb. A first pixel on the first virtual line IL1' or IL2' with respect to the second red pixel Par is a sub-pixel emitting light of a different color than the second red pixel Par, that is, the first blue pixel Pmb or the first green pixel Pmg. Accordingly, a second edge distance $D2rb$ and a second edge distance $D2rg$, which are equal to a minimum value among the first and second widths $d1a$ and $d1b$ and the fifth and sixth widths $d2a'$ and $d2b'$ or a value greater than the minimum value, may be respectively set between the second red pixel Par and the first blue pixel Pmb in the y direction and between the second red pixel Par and the first green pixel Pmg in the x direction.

Figure 16:
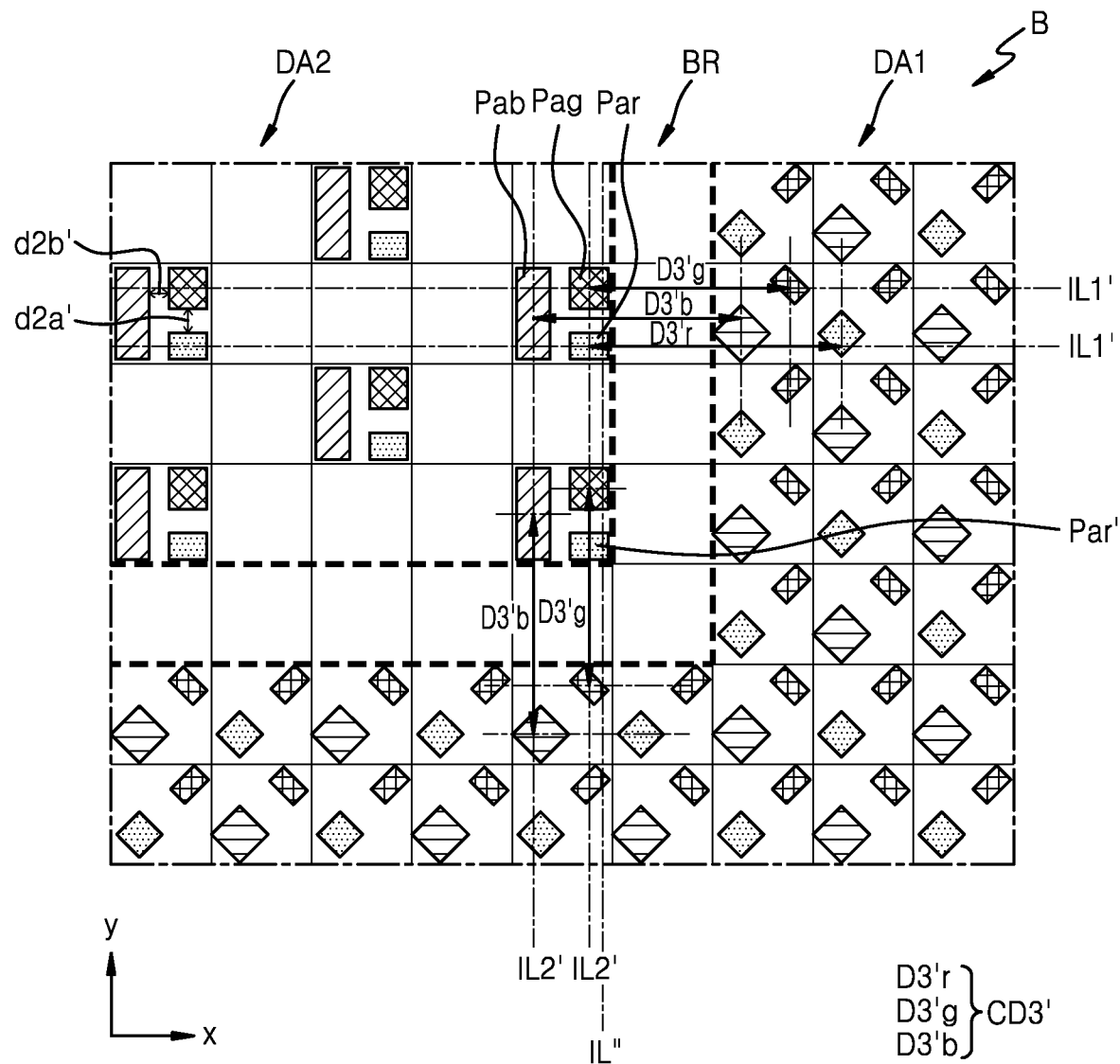
Figure 17:
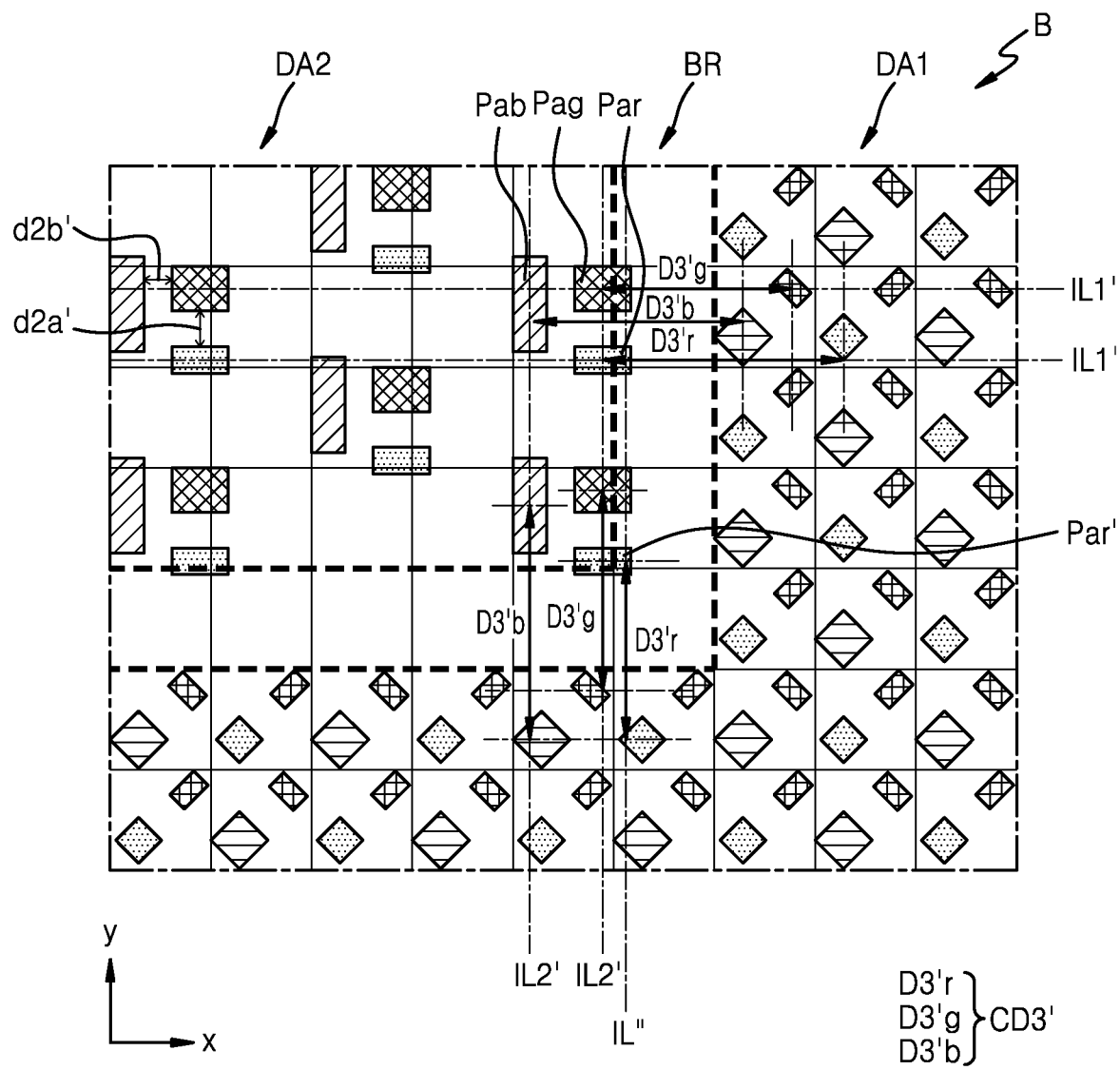

Referring to FIG. 16, a center distance CD3' between centers of a first pixel Pm and a second pixel Pa, which correspond to each other, on the first virtual line IL1' extending parallel to the x-direction or the first virtual line IL2' extending parallel to the y-direction may be within ±30% of twice the pixel pitch PP ($(PP \times 2 \times 0.7) < CD3' < (PP \times 2 \times 1.3)$). The center distance CD3' between a first pixel Pm and a second pixel Pa, which correspond to each other, on the first virtual line IL1' may be the shortest straight line distance between a line passing through the center of the first pixel Pm in the y-direction and a line passing through the center of the second pixel Pa in the y-direction. The center distance CD3' between a first pixel Pm and a second pixel Pa, which correspond to each other, on the first virtual line IL2' may be the shortest straight line distance between a line passing through the center of the first pixel Pm in the x-direction and a line passing through the center of the second pixel Pa in the x-direction.

A center distance D3'r between a second red pixel Par and a first red pixel Pmr, which are adjacent to the boundary area BR, on the first virtual line IL1' or IL2', a center distance D3'g between a second green pixel Pag and a first green pixel Pmg, which are adjacent to the boundary area BR, on the first virtual line IL1' or IL2', and a center distance D3'b between a second blue pixel Pab and a first blue pixel Pmb, which are adjacent to the boundary area BR, on the first virtual line IL1' or IL2' may be within ±30% of twice the pixel pitch PP. FIG. 16 illustrates an example in which, with respect to a second red pixel Par adjacent to a corner of the boundary area BR, the first virtual line IL2' or a second virtual line IL" passing through the second pixel Par does not pass through a corresponding sub-pixel, that is a first red pixel Pmr.

On the other hand, FIG. 17 illustrates an example in which, with respect to a second red pixel Par adjacent to a corner of the boundary area BR, a second virtual line IL" passes through a first red pixel Pmr. Depending on the size and structure of the pixel group PG including second pixels Pa, the first virtual lines IL1 and IL2' or the second virtual line IL" passing through a second pixel Pa may or may not pass through a first pixel Pm of the corresponding sub-pixel. In the embodiment of FIG. 17, a center distance D3'r between a second red pixel Par and a first red pixel Pmr, which are adjacent to the boundary area BR, on the first virtual line IL2', a center distance D3'r between a second red pixel Par and a first red pixel Pmr, which are adjacent to the boundary area BR, on the second virtual line IL", a center distance D3'g between a second green pixel Pag and a second green pixel Pmg, which are adjacent to the boundary area BR, on the first virtual line IL1' or IL2', and a center distance D3'b between a second blue pixel Pab and a first blue pixel Pmg, which are adjacent to the boundary area BR, on the first virtual line IL1' or IL2' may be within ±30% of twice the pixel pitch PP.

In a display device according to one or more embodiments, a pixel area and a transmission area with improved light transmittance are in a second display area corresponding to a component such as a sensor and a camera, thereby creating an environment, in which the component may operate, and implementing an image in an area overlapping the component. Accordingly, a display device having various functions and improved quality may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a first display area and a second display area;
   first pixels in the first display area; and
   second pixels in the second display area,
   wherein a distance between a first sub-pixel from among the first pixels and a second sub-pixel from among the second pixels has a value based on a pixel pitch,
   wherein the first sub-pixel and the second sub-pixel are adjacent to a boundary area between the first display area and the second display area,
   wherein the second sub-pixel is a pixel through which a virtual line first passes, from among the second pixels, in the second display area, the virtual line passing through a center of the first sub-pixel,
   wherein the virtual line is parallel to data lines or scan lines connected to the second pixels,
   wherein a first distance between the first sub-pixel and the second sub-pixel when the first sub-pixel and the second sub-pixel emit same colors is different from a second distance between the first sub-pixel and the second sub-pixel when the first sub-pixel and the second sub-pixel emit different colors, and
   wherein the first distance and the second distance are a shortest straight-line distance between an edge of the first sub-pixel and an edge of the second sub-pixel.

2. The display device of claim 1, wherein the second pixels are in units of pixel groups,
   wherein the second display area comprises transmission areas and the transmission areas surround the pixel groups.

3. The display device of claim 2, wherein a structuring of the second pixels constituting the pixel groups is same as or different from a structuring of the first pixels.

4. The display device of claim 2, further comprising an inorganic insulating layer on the substrate,
   wherein the inorganic insulating layer includes an opening corresponding to the transmission areas and the boundary area.

5. The display device of claim 1, wherein an area of each of the second pixels is different from an area of a first pixel corresponding to the second pixel.

6. The display device of claim 1, wherein the pixel pitch is a center distance between first pixels emitting green light.

7. The display device of claim 1, wherein the first distance between the first sub-pixel and the second sub-pixel is greater than or equal to the pixel pitch.

8. The display device of claim 1, wherein the second distance between the first sub-pixel and the second sub-pixel has a minimum value among gap values of a pixel-defining layer between the first pixels and gap values of a pixel-defining layer between the second pixels or a value that is greater than the minimum value.

9. The display device of claim 1, wherein a second resolution of the second display area is less than a first resolution of the first display area.

10. A display device comprising:
    a substrate including a first display area and a second display area including a transmission area;
    first pixels in the first display area; and
    second pixels in the second display area,
    wherein a distance between a first sub-pixel from among the first pixels and a second sub-pixel from among the second pixels is greater than or equal to a minimum value among gap values of a pixel-defining layer between the first pixels and gap values of a pixel-defining layer between the second pixels,
    wherein the first sub-pixel and the second sub-pixel are adjacent to a boundary area between the first display area and the second display area, and emit different colors.

11. The display device of claim 10, wherein the second sub-pixel is a pixel through which a virtual line passes, from among the second pixels, in the second display area, the virtual line passing through a center of the first sub-pixel.

12. The display device of claim 11, wherein the virtual line is parallel to data lines or scan lines connected to the second pixels.

13. The display device of claim 10, wherein the second pixels are in units of pixel groups, wherein transmission areas surround the pixel groups.

14. The display device of claim 13, wherein a structuring of the second pixels constituting the pixel groups is same as or different from a structuring of the first pixels.

15. The display device of claim 10, wherein an area of each of the second pixels is different from an area of a first pixel corresponding to the second pixel.

16. The display device of claim 10, wherein a second resolution of the second display area is less than a first resolution of the first display area.

17. A display device comprising:
a substrate including a first display area and a second display area;
first pixels in the first display area; and
second pixels in the second display area,
wherein a center distance between a first sub-pixel from among the first pixels and a second sub-pixel from among the second pixels is within a certain range of twice a pixel pitch
wherein the first sub-pixel and the second sub-pixel are adjacent to a boundary area between the first display area and the second display area, and emit a same color,
wherein the second sub-pixel is a pixel through which a virtual line first passes, from among the second pixels, in the second display area, the virtual line passing through a center of the first sub-pixel,
wherein the virtual line is parallel to data lines or scan lines connected to the second pixels, and
wherein the center distance is a shortest straight-line distance between a center of the first sub-pixel and a center of the second sub-pixel.

18. The display device of claim 17, wherein the second pixels are in units of pixel groups, wherein transmission areas surround the pixel groups.

19. The display device of claim 18, wherein a structuring of the second pixels constituting the pixel groups is same as or different from a structuring of the first pixels.

20. The display device of claim 17, wherein the pixel pitch is a center distance between first pixels emitting green light.

21. The display device of claim 17, wherein a second resolution of the second display area is less than a first resolution of the first display area.

22. The display device of claim 17, wherein an area of each of the second pixels is different from an area of a first pixel corresponding to the second pixel.

23. The display device of claim 17, wherein the virtual line is parallel to data lines or scan lines connected to the second pixels.

* * * * *